US012500566B2

(12) United States Patent
Jiao et al.

(10) Patent No.: US 12,500,566 B2
(45) Date of Patent: Dec. 16, 2025

(54) FILTER, RADIO FREQUENCY DEVICE AND ELECTRONIC APPARATUS

(71) Applicant: BOE TECHNOLOGY GROUP CO., LTD., Beijing (CN)

(72) Inventors: Zhuofan Jiao, Beijing (CN); Feng Qu, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 181 days.

(21) Appl. No.: 18/279,971

(22) PCT Filed: Jul. 26, 2022

(86) PCT No.: PCT/CN2022/107959
§ 371 (c)(1),
(2) Date: Sep. 1, 2023

(87) PCT Pub. No.: WO2024/020785
PCT Pub. Date: Feb. 1, 2024

(65) Prior Publication Data
US 2025/0030395 A1    Jan. 23, 2025

(51) Int. Cl.
*H03H 9/00* (2006.01)
*H03H 9/54* (2006.01)
*H03H 9/56* (2006.01)

(52) U.S. Cl.
CPC .......... *H03H 9/0014* (2013.01); *H03H 9/542* (2013.01); *H03H 9/564* (2013.01); *H03H 9/566* (2013.01)

(58) Field of Classification Search
CPC ........ H03H 9/6483; H03H 9/725; H03H 9/72; H03H 9/25; H03H 9/568; H03H 9/0576;
(Continued)

(56) References Cited

U.S. PATENT DOCUMENTS 7,573,354 B2    8/2009  Nishihara et al.
7,830,226 B2 *  11/2010  Nam ...................... H03H 9/706
                                                 333/133
(Continued)

FOREIGN PATENT DOCUMENTS

CN    1913348 B      6/2010
CN    109831176 A    5/2019
(Continued)

*Primary Examiner* — John W Poos
(74) *Attorney, Agent, or Firm* — Scully, Scott, Murphy & Presser, P.C.

(57) ABSTRACT

A filter, a radio frequency device and an electronic apparatus. The filter includes a series branch, N parallel branches and a bridged branch; the series branch includes M series resonators; each of the N parallel branches includes a parallel resonator; the bridged branch includes a bridged resonator and a first inductor, the first end of each of the parallel branches is grounded, the second end of each of the parallel branches is connected with the series branch, the third end is located at a side of the bridged resonator away from the first inductor, the fourth end is located at a side of the first inductor away from the bridged resonator, the third end is connected to the first end of the ith parallel branch, the fourth end is connected to the second end of the (i+k)th parallel branch.

18 Claims, 14 Drawing Sheets

(58) Field of Classification Search
CPC .. H03H 9/145; H03H 9/14541; H03H 9/6489; H03H 7/075; H03H 7/38; H03H 7/46; H03H 9/0557; H03H 9/059; H03H 9/205; H03H 9/542; H03H 9/605; H03H 9/6423; H03H 9/70; H03H 9/706; H03H 7/0161; H03H 9/0085; H03H 9/02228; H03H 9/02559; H03H 9/02574; H03H 9/0274; H03H 9/02992; H03H 9/14526; H03H 9/1457; H03H 9/6406; H03H 9/6433; H03H 9/6436
See application file for complete search history.

(56) References Cited

U.S. PATENT DOCUMENTS

2006/0139120 A1\* 6/2006 Yamaguchi .......... H03H 9/6483
333/195
2019/0341910 A1\* 11/2019 Pang ........................ H03H 9/64

FOREIGN PATENT DOCUMENTS

| CN | 110838833 | A | 2/2020 | |
| CN | 111162752 | \* | 5/2020 | ............... H03H 9/46 |
| CN | 111162752 | A | 5/2020 | |
| CN | 111200418 | A | 5/2020 | |
| CN | 111262550 | A | 6/2020 | |
| CN | 111342806 | A | 6/2020 | |
| CN | 111525909 | A | 8/2020 | |
| CN | 111600574 | A | 8/2020 | |
| CN | 112073018 | A | 12/2020 | |
| CN | 215072334 | U | 12/2021 | |
| CN | 113992185 | A | 1/2022 | |
| EP | 1533897 | A2 | 5/2005 | |
| EP | 4084332 | A1 | 11/2022 | |
| JP | 4170865 | B2 | 10/2008 | |
| KR | 970000559 | B1 | 1/1997 | |
| WO | 2017219251 | A1 | 12/2017 | |
| WO | 2022089545 | A1 | 5/2022 | |

\* cited by examiner

100

```
Radio frequency device 300

Filter 100
```

```
Electronic apparatus
       500
Radio frequency device
         300
```

FILTER, RADIO FREQUENCY DEVICE AND ELECTRONIC APPARATUS

CROSS-REFERENCE TO RELATED APPLICATION

This application is a U.S. National Phase of International Application No. PCT/CN2022/107959, filed on Jul. 26, 2022, the entire disclosure of which is incorporated herein by reference as part of the present application.

TECHNICAL FIELD

Embodiments of the present disclosure relates to a filter, a radio frequency device, and an electronic apparatus.

BACKGROUND

With the rapid development of mobile communication technology, the application of radio frequency device has increased significantly; as an important component in the radio frequency device, the usage of filter will significantly increase, thereby driving explosive growth in the filter market. At present, the filters applied to the personal mobile ends (such as mobile phones) are piezoelectric acoustic wave filters, piezoelectric acoustic wave filters are mainly composed of resonators, these resonators may include: film bulk acoustic resonators (FBAR), solid state mounted resonators (SMR), surface acoustic wave resonators (SAW); in which, the film bulk acoustic resonators (FBAR) and the solid state mounted resonators (SMR) can be collectively referred to as bulk acoustic wave resonator (BAW).

A working principle of a surface acoustic wave resonator is to convert the electrical signal into an acoustic wave propagating on a surface of the piezoelectric layer through an interdigital transducer, resonant frequency of the surface acoustic wave resonator can be determined by spacing between strip electrodes in the interdigital transducer; a working principle of a bulk acoustic wave resonator is to convert the electrical signal into a bulk acoustic wave propagating along a thickness direction of the piezoelectric layer, the resonant frequency is determined by a thickness of the piezoelectric layer. The difference between the thin film bulk acoustic resonator and the solid state fabricated resonator is that the thin film bulk acoustic resonator uses the acoustic impedance of air to be approximately equal to zero to achieve total reflection of interface acoustic waves, while the solid-state assembled resonator realizes total reflection based on Bragg reflection layers alternately composed of high acoustic impedance layers and low acoustic impedance layers.

SUMMARY

Embodiments of the present disclosure provide a filter, a radio frequency device and an electronic apparatus. By connecting the bridged resonator and the first inductor in series and then bridging the bridged resonator between the first end of the ith parallel branch and the second end of the (i+2)th parallel branch, the introduction of the bridged resonator can increase two zero points in the passband, and the value of the first inductance can move these two zeros to a suitable position outside the passband, to increase out-of-band suppression, and simultaneously play a role in optimizing the impedance matching of the input and output ports, so that insertion loss is reduced. In this way, the filter can simultaneously reduce insertion loss and improve out-of-band suppression performance.

At least one embodiment of the present disclosure provides a filter, which includes: a series branch, including M series resonators arranged in series; N parallel branches, each of the N parallel branches including a parallel resonator; and a bridged branch, including a bridged resonator and a first inductor, each of the parallel branches includes a first end and a second end that are opposite to each other, the first end of each of the parallel branches is grounded, the second end of each of the parallel branches is connected with the series branch, the bridged branch includes a third end and a fourth end, the third end is located at a side of the bridged resonator away from the first inductor, the fourth end is located at a side of the first inductor away from the bridged resonator, the third end is connected to the first end of the ith parallel branch, the fourth end is connected to the second end of the (i+k)th parallel branch, both M and N are positive integers greater than or equal to 3, i is a positive integer greater than or equal to 1 and less than or equal to N−k, and k is a positive integer greater than or equal to 2.

For example, in the filter provided by an embodiment of the present disclosure, the value of k is 2.

For example, in the filter provided by an embodiment of the present disclosure, the second end of the first parallel branch is located between the first series resonator and the second series resonator, the second end of the jth parallel branch is located between the jth series resonator and the (j+1)th series resonator, the second end of the Nth parallel branch is located between the Nth series resonator away from the (N−1)th series resonator, and j is a positive integer greater than 1 and less than N.

For example, in the filter provided by an embodiment of the present disclosure, the value of i is 1, and the values of M and N are equal.

For example, in the filter provided by an embodiment of the present disclosure, the series branch includes an input end and an output end that are arranged opposite to each other, the M series resonators are arranged between the input end and the output end, the filter further includes: a second inductor, the second inductor is arranged in parallel with the first series resonator.

For example, in the filter provided by an embodiment of the present disclosure, a value range of an inductance of the second inductor is from 5 nH to 9 nH.

For example, the filter provided by an embodiment of the present disclosure further includes: a third inductor, one end of the third inductor is grounded, and the other end of the third inductor is connected with the output end.

For example, in the filter provided by an embodiment of the present disclosure, a value range of an inductance of the third inductor is from 10 nH to 17 nH.

For example, in the filter provided by an embodiment of the present disclosure, a value range of the inductance of the first inductor is from 10 nH to 17 nH.

For example, in the filter provided by an embodiment of the present disclosure, the series branch includes an input end and an output end that are arranged opposite to each other, the M series resonators are arranged between the input end and the output end, the filter further includes: a fourth inductor, the fourth inductor is arranged in series between the first series resonator and the second end of the first parallel branch.

For example, in the filter provided by an embodiment of the present disclosure, a value range of an inductance of the first inductor is from 11 nH to 18 nH, and a value range of an inductance of the fourth inductor is from 0.3 nH to 0.7 nH.

For example, in the filter provided by an embodiment of the present disclosure, the filter further includes: a fifth inductor, the fifth inductor is arranged in series between the first end of the Nth parallel branch and the parallel resonator.

For example, in the filter provided by an embodiment of the present disclosure, a value range of an inductance of the first inductor is from 10 nH to 17 nH, and a value range of an inductance of the fifth inductor is 4.5 nH-6.5 nH.

For example, in the filter provided by an embodiment of the present disclosure, at least one of the M series resonators and the parallel resonators in the N parallel branches is a bulk acoustic wave resonator.

For example, in the filter provided by an embodiment of the present disclosure, the bulk acoustic wave resonator includes: a substrate; a piezoelectric film; a first driving electrode; and a second driving electrode.

For example, in the filter provided by an embodiment of the present disclosure, the M series resonators include a first bulk acoustic wave resonator and a second bulk acoustic wave resonator, the first bulk acoustic wave resonator and the second bulk acoustic wave resonator adopt a structure of the bulk acoustic wave resonator, the filter further includes an insulating layer and a first connection electrode, a second connection electrode, a third connection electrode and a fourth connection electrode that are located at a side of the insulating layer away from the substrate, the first connection electrode is electrically connected with the first driving electrode of the first bulk acoustic wave resonator through a via hole in the insulating layer and the piezoelectric film, the second connection electrode is electrically connected with the second driving electrode of the first bulk acoustic wave resonator through a via hole in the insulating layer, the third connection electrode is electrically connected with the first driving electrode of the second bulk acoustic wave resonator through a via hole in the insulating layer and the piezoelectric film, and the fourth connection electrode is connected with the second driving electrode of the second bulk acoustic wave resonator through a via hole in the insulating layer, and the third connection electrode is connected with the second connection electrode to connect the first bulk acoustic wave resonator and the second bulk acoustic wave resonator in series.

For example, in the filter provided by an embodiment of the present disclosure, the ith parallel branch includes a first bulk acoustic wave resonator, the bridged resonator includes a second bulk acoustic wave resonator, the first bulk acoustic wave resonator and the second bulk acoustic wave resonator adopt a structure of the bulk acoustic wave resonator, the filter further includes an insulating layer and a first connection electrode, a second connection electrode, a third connection electrode and a fourth connection electrode that are located at a side of the insulating layer away from the substrate, the first connection electrode is electrically connected with the first driving electrode of the first bulk acoustic wave resonator through a via hole in the insulating layer and the piezoelectric film, the second connection electrode is electrically connected with the second driving electrode of the first bulk acoustic wave resonator through a via hole in the insulating layer, the third connection electrode is electrically connected with the first driving electrode of the second bulk acoustic wave resonator through a via hole in the insulating layer and the piezoelectric film, and the fourth connection electrode is connected with the second driving electrode of the second bulk acoustic wave resonator through a via hole in the insulating layer, and the third connection electrode is connected with the second connection electrode to connect the first bulk acoustic wave resonator and the second bulk acoustic wave resonator in series.

For example, in the filter provided by an embodiment of the present disclosure, the bulk acoustic wave filter further includes: an air gap, located in the substrate, the first driving electrode is located at a side of the piezoelectric film close to the substrate, the second driving electrode is located at a side of the piezoelectric film away from the substrate, and the air gap is located at a side of the substrate close to the first driving electrode, or the air gap is located at a side of the substrate away from the first driving electrode.

For example, in the filter provided by an embodiment of the present disclosure, the M series resonators include a third bulk acoustic resonator and a fourth bulk acoustic resonator, the third bulk acoustic wave resonator and the fourth bulk acoustic wave resonator adopt a structure of the bulk acoustic wave resonator, the first driving electrode of the third bulk acoustic wave resonator is located at a side of the piezoelectric film away from the substrate, the second driving electrode of the third bulk acoustic wave resonator is located at a side of the piezoelectric film close to the substrate, the first driving electrode of the fourth bulk acoustic wave resonator is located at a side of the piezoelectric film close to the substrate, and the second driving electrode of the fourth bulk acoustic wave resonator is located at a side of the piezoelectric film away from the substrate, and the second driving electrode of the third bulk acoustic wave resonator and the first driving electrode of the fourth bulk acoustic wave resonator are arranged on a same layer and electrically connected, to connect the third bulk acoustic wave resonator and the fourth bulk acoustic wave resonator in series.

For example, in the filter provided by an embodiment of the present disclosure, the ith parallel branch includes a third bulk acoustic wave resonator, the bridged resonator includes a fourth bulk acoustic wave resonator, the third bulk acoustic wave resonator and the fourth bulk acoustic wave resonator adopt a structure of the bulk acoustic wave resonator, the first driving electrode of the third bulk acoustic wave resonator is located at a side of the piezoelectric film away from the substrate, the second driving electrode of the third bulk acoustic wave resonator is located at a side of the piezoelectric film close to the substrate, the first driving electrode of the fourth bulk acoustic wave resonator is located at a side of the piezoelectric film close to the substrate, and the second driving electrode of the fourth bulk acoustic wave resonator is located at a side of the piezoelectric film away from the substrate, and the second driving electrode of the third bulk acoustic wave resonator and the first driving electrode of the fourth bulk acoustic wave resonator are arranged on a same layer and electrically connected, to connect the third bulk acoustic wave resonator and the fourth bulk acoustic wave resonator in series.

For example, in the filter provided by an embodiment of the present disclosure, the bulk acoustic wave filter further includes: high acoustic impedance layers and low acoustic impedance layers that are alternately arranged, the high acoustic impedance layers and the low acoustic impedance layers are located at a side of the piezoelectric film close to the substrate.

For example, in the filter provided by an embodiment of the present disclosure, the bridged resonator includes a fifth bulk acoustic resonator, the (i+k)th series resonator includes a sixth bulk acoustic wave resonator, the fifth bulk acoustic wave resonator and the sixth bulk acoustic wave resonator adopt a structure of the bulk acoustic wave resonator, the filter further includes an insulating layer and a fifth connection electrode, a sixth connection electrode, a seventh connection electrode, and an eighth connection electrode that are located at a side of the insulation layer away from the substrate, the fifth connection electrode is electrically connected with the first driving electrode of the fifth bulk acoustic wave resonator through a via hole in the insulating layer and the piezoelectric film, the sixth connection electrode is electrically connected with the second driving electrode of the fifth bulk acoustic wave resonator through a via hole in the insulating layer, the seventh connection electrode is electrically connected with the first driving electrode of the sixth bulk acoustic wave resonator through a via hole in the insulating layer and the piezoelectric film, and the eighth connection electrode is connected with the second driving electrode of the sixth bulk acoustic wave resonator through a via hole in the insulating layer, the first inductor is located at a side of the insulating layer away from the substrate, and is respectively connected with the sixth connection electrode and the eighth connection electrode.

For example, in the filter provided by an embodiment of the present disclosure, the first inductor is a single-layer inductor or a three-dimensional inductor.

At least one embodiment of the present disclosure further provides a radio frequency device, including any one of the abovementioned filters.

At least one embodiment of the present disclosure further provides an electronic apparatus, including any one of the abovementioned radio frequency device.

BRIEF DESCRIPTION OF DRAWINGS

In order to clearly illustrate the technical solution of the embodiments of the present disclosure, the drawings of the embodiments will be briefly described. It is obvious that the described drawings in the following are only related to some embodiments of the present disclosure and thus are not construed as any limitation to the present disclosure.

DETAILED DESCRIPTION

Figure 1:
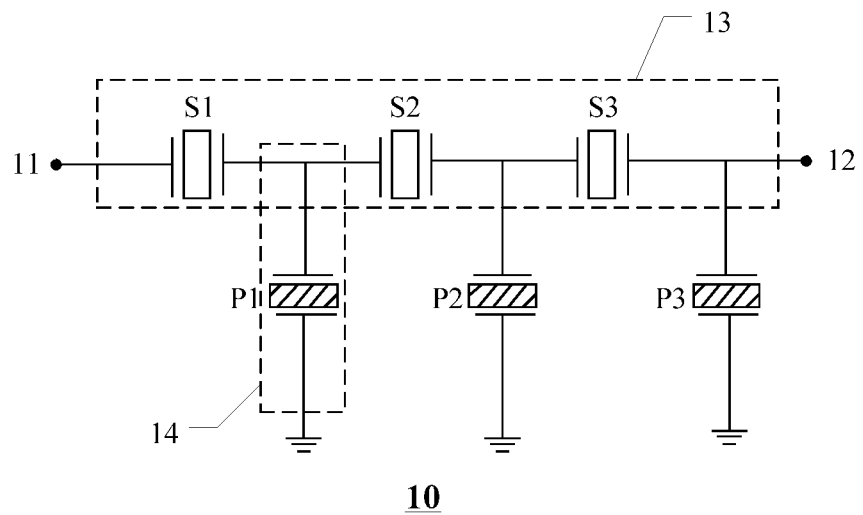
FIG. 1 is a schematic diagram of a bulk acoustic wave filter.

In order to make objectives, technical details, and advantages of the embodiments of the present disclosure clearer, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Unless otherwise defined, the features used in embodiments of the present disclosure, such as "parallel", "vertical", and "identical", all include strictly defined situations such as "parallel", "vertical", and "identical", as well as situations where "substantially parallel", "substantially vertical", and "substantially identical" contain certain errors. For example, the above "substantially" can indicate that the difference between the compared objects is 10% of the average value of the compared objects, or within 5%. When the number of a component or element is not specifically specified in the following embodiments of this disclosure, it means that the component or element can be one or multiple, or can be understood as at least one. "At least one" refers to one or more, and "a plurality of" or "multiple" refers to at least two.

For a filter used in a radio frequency device, the key performance indicators include insertion loss, out-of-band suppression, and roll-off coefficient. The insertion loss is often represented by the parameter IL (Insertion loss), because a signal does not fully reach an output end, energy loss must occur in the case that the signal passes through the filter, the insertion loss defines the energy loss, which can be expressed as a ratio of input power Pin to output power PL, that is IL (dB)=10*lg(Pin/PL)=−S21, in which S21 is the transmission coefficient from the input end to the output end, which can be measured by a vector network analyzer. The out-of-band suppression is an amount of attenuation outside the passband range of the filter, which indicates the ability to suppress unwanted frequency signals. The roll-off coefficient, also known as a rectangular coefficient, which describes the steepness of the transition band of the filter, and the steeper the filter, the better the frequency selection performance; and the roll-off coefficient can usually be expressed as a ratio of the 60 dB bandwidth to the 3 dB bandwidth.

FIG. 1 is a schematic diagram of a bulk acoustic wave filter. As illustrated by FIG. 1, the bulk acoustic wave filter 10 includes an input end 11, an output end 12, a series branch 13 and three parallel branches 14 connected between the input end 11 and the output end 12. The series branch 13 comprises three series resonators S1, S2 and S3 arranged in series; the three parallel branches 14 include a first parallel branch, a second parallel branch and a third parallel branch; the first parallel branch comprises a parallel resonator P1, one end of the parallel resonator P1 is connected between the series resonator S1 and the series resonator S2, the other end is grounded; the second parallel branch comprises a parallel resonator P2, one end of the parallel resonator P2 is connected between the series resonator S2 and the series resonator S3, the other end is grounded; and the third parallel branch comprises a parallel resonator P3, one end of the parallel resonator P3 is connected between the series resonator S3 and the output end 12, the other end is grounded.

Figure 2:
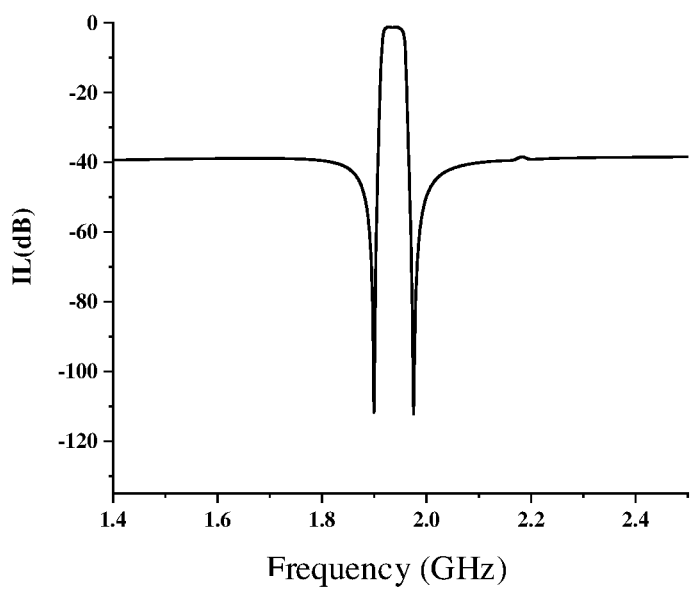
FIG. 2 is a S21 curve diagram of the filter shown in FIG. 1 in a broadband range.
Figure 3:
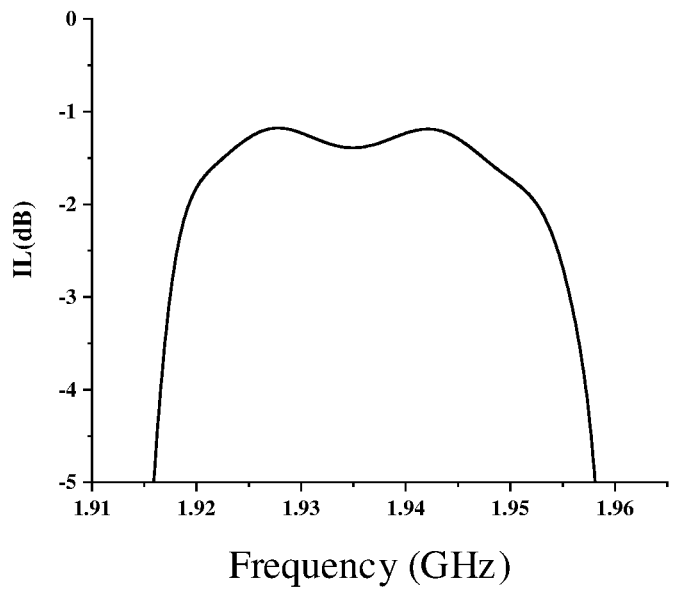
FIG. 3 is an S21 curve diagram of the filter shown in FIG. 1 at a center frequency place.

FIG. 2 is a transmission coefficient curve diagram of the filter shown in FIG. 1 in a wide frequency range; and FIG. 3 shows a transmission coefficient curve of the filter shown in FIG. 1 at the center frequency. As illustrated by FIG. 2 and FIG. 3, the minimum insertion loss of the filter is 1.18 dB, the out-of-band suppression is less than 40 dB. This is because, for the filter of the 3-step topology, the number of resonant units that the signal needs to pass through is large, resulting in increased insertion loss; but for the out-of-band suppression parameters, the number of orders of the filter of the 3-step ladder topology is relatively small, which is not enough to achieve better out-of-band suppression.

Therefore, in order to improve the performance of both the insertion loss and the out-of-band suppression, embodiments of the present disclosure provide a filter, a radio frequency device and an electronic apparatus. The filter includes a series branch, N parallel branches and a bridged branch; the series branch includes M series resonators arranged in series; each of the N parallel branches includes a parallel resonator; the bridged branch includes a bridged resonator and a first inductance; each of the parallel branches includes a first end and a second end that are opposite to each other, the first end of each of the parallel branches is grounded, the second end of each of the parallel branches is connected with the series branch; the bridged branch includes a third end and a fourth end, the third end is located at a side of the bridged resonator away from the first inductor, the fourth end is located at a side of the first inductor away from the bridged resonator, the third end is connected to the first end of the ith parallel branch, the fourth end is connected to the second end of the (i+2)th parallel branch, both M and N are positive integers greater than or equal to 3, i is a positive integer greater than or equal to 1 and less than or equal to N−2.

In the filter provided by the embodiment of the present disclosure, the bridged resonator and the first inductor are connected in series and connected between the first end of the ith parallel branch and the second end of the (i+2)th parallel branch, the introduction of the bridged resonator adds two zeros in the passband; and the value of the first inductance can move these two zeros to a suitable position outside the passband to increase out-of-band suppression, at the same time, the first inductance plays the role of optimizing the impedance matching of the input end and the output end, thus reducing the insertion loss. In this way, the filter can simultaneously reduce insertion loss and improve out-of-band suppression performance.

Hereinafter, the filter, the radio frequency device and the electronic apparatus provided by the embodiments of the present disclosure will be described in detail with reference to the accompanying drawings.

Figure 4:
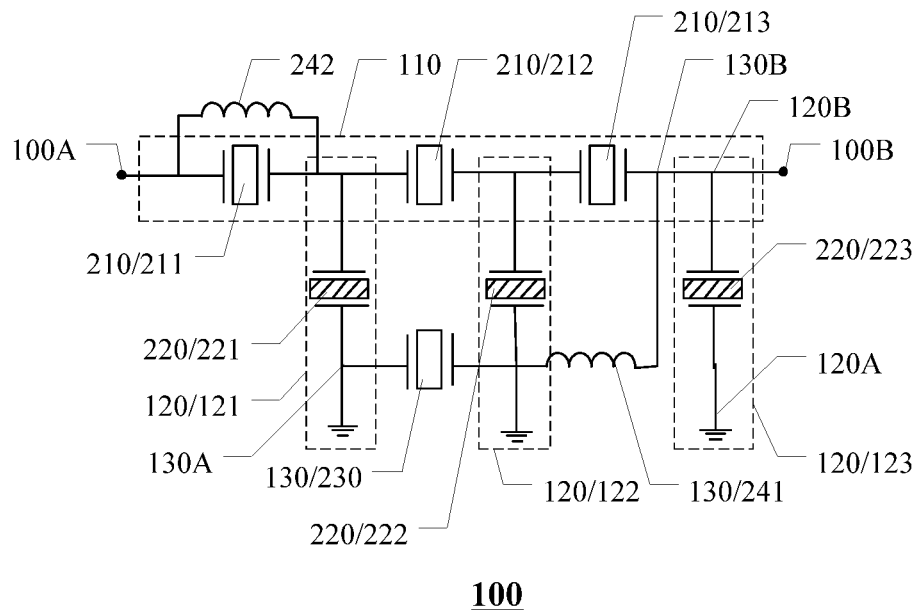
FIG. 4 is a schematic diagram of a filter provided by an embodiment of the present disclosure.

At least one embodiment of the present disclosure provides a filter. FIG. 4 is a schematic diagram of a filter provided by an embodiment of the present disclosure. As illustrated by FIG. 4, the filter 100 includes a series branch 110, N parallel branches 120 and a bridged branch 130; the series branch 110 includes M series resonators 210 arranged in series; each of the parallel branches 120 includes a parallel resonator 220; the bridged branch 130 includes a bridged resonator 230 and a first inductance 241; each of the parallel branches 120 includes a first end 120A and a second end 120B that are opposite to each other, the first end 120A of each of the parallel branches 120 is grounded, the second end 120B of each of the parallel branches 120 is connected with the series branch 110; the bridged branch 130 includes a third end 130A and a fourth end 130B, the third end 130A is located at a side of the bridged resonator 230 away from the first inductor 241, the fourth end 130B is located at the side of the first inductor 241 away from the bridged resonator 230, that is, the bridged resonator 230 and the first inductor 241 are arranged in series between the third end 130A and the fourth end 130B.

As illustrated by FIG. 4, the third end 130A is connected with the first end 120A of the ith parallel branch 120, the fourth end 130B is connected with the second end 120B of the (i+k)th parallel branch 120; that is, the third end 130A is connected with the side of the parallel resonator 220 in the ith parallel branch 120 away from the series branch 110, and the fourth end 130B is connected with the position where the (i+k)th parallel branch 120 is connected with the series branch 110. Both M and N are positive integers greater than or equal to 3, i is a positive integer greater than or equal to 1 and less than or equal to N−k, and k is a positive integer greater than or equal to 2. It should be noted that, the above "connected" refers to electrically connected.

In the filter provided by the embodiment of the present disclosure, the bridged resonator and the first inductor are connected in series and connected between the first end of the ith parallel branch and the second end of the (i+k)th parallel branch, the introduction of the bridged resonator adds two zeros in the passband, the value of the first inductance can move these two zeros to a suitable position outside the passband to increase the out-of-band suppression, and the bridged resonator simultaneously play a role of optimizing the impedance matching of the input end and the output end, thus reducing the insertion loss. In this way, the filter can simultaneously reduce insertion loss and improve out-of-band suppression performance.

In some examples, at least one of the M series resonators 210 and the parallel resonators 220 in the N parallel branches 120 is a bulk acoustic wave resonator. In this way, the filter can have the advantages of lower insertion loss, high Q value, steeper roll-off characteristics, and larger power capacity.

In some examples, the M series resonators 210 and the parallel resonators 220 in the N parallel branches 120 may all use bulk acoustic wave resonators.

For example, the abovementioned bulk acoustic resonator may be at least one of a film bulk acoustic resonator (FBAR) and a solid-state mount resonator (SMR).

Figure 5A:
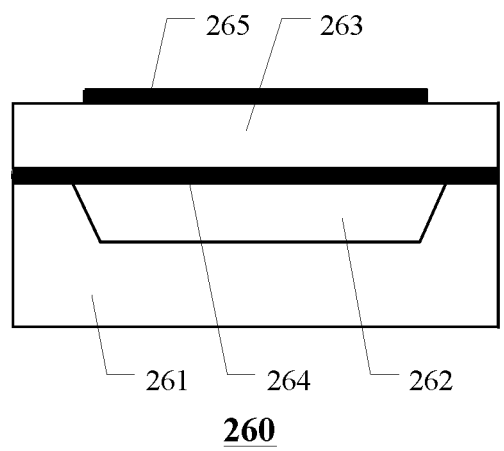
FIG. 5A is a structural schematic diagram of a bulk acoustic wave resonator provided by an embodiment of the present disclosure.
Figure 5B:
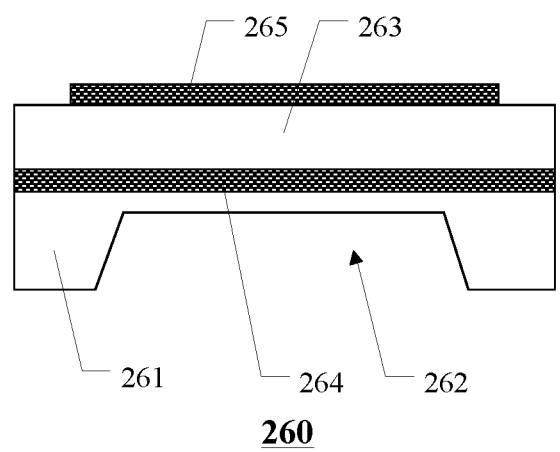
FIG. 5B is a structural schematic diagram of another bulk acoustic wave resonator provided by an embodiment of the present disclosure.

FIG. 5A is a structural schematic diagram of a bulk acoustic wave resonator provided by an embodiment of the present disclosure; FIG. 5B is a structural schematic diagram of another bulk acoustic wave resonator provided by an embodiment of the present disclosure; and FIG. 5C is a structural schematic diagram of another bulk acoustic wave resonator provided by an embodiment of the present disclosure.

As illustrated by FIG. 5A, the bulk acoustic wave resonator 260 includes a substrate 261, an air gap 262 located in the substrate 261, a piezoelectric film 263, and a first driving electrode 264 and a second driving electrode 265 located on two sides of the piezoelectric film 263; the first driving electrode 264 is located at a side of the piezoelectric film 263 close to the substrate 261; the second driving electrode 265 is located at a side of the piezoelectric film 263 away from the substrate 261. The air gap 262 is located at a side of the substrate 161 close to the first driving electrode 264, which can be obtained by etching from the side of the substrate 161 close to the first driving electrode 264. In this way, the bulk acoustic wave resonator 260 can convert electrical signals into bulk acoustic waves propagating along the thickness direction of the piezoelectric film, and use the air gap to realize the total reflection of the interface acoustic wave.

As illustrated by FIG. 5B, the bulk acoustic wave resonator 260 includes a substrate 261, an air gap 262 located in the substrate 261, a piezoelectric film 263, and a first driving electrode 264 and a second driving electrode 265 located on two sides of the piezoelectric film 263; the first driving electrode 264 is located at a side of the piezoelectric film 263 close to the substrate 261; the second driving electrode 265 is located at a side of the piezoelectric film 263 away from the substrate 261. The air gap 262 is located at a side of the substrate 161 away from the first driving electrode 264, which can be obtained by etching from a side of the substrate 161 away from the first driving electrode 264. In this way, the bulk acoustic wave resonator 260 can convert electrical signals into bulk acoustic waves propagating along the thickness direction of the piezoelectric film, and use the air gap to realize the total reflection of the interface acoustic wave. As illustrated by FIG. 5C, the bulk acoustic wave resonator 270 includes a substrate 271, a plurality of alternately arranged high acoustic impedance layers 272 and low acoustic impedance layers 273 on the substrate 271, a piezoelectric film 274, and a first driving electrode 275 and a second driving electrode 275 located on two sides of the piezoelectric film 274; the first driving electrode 275 is located at the side of the piezoelectric film 274 close to the substrate 271; and the second driving electrode 276 is located at a side of the piezoelectric film 274 away from the substrate 271. In this way, the bulk acoustic wave resonator 270 can convert electrical signals into bulk acoustic waves propagating along the thickness direction of the piezoelectric film, and use a Bragg reflection layer composed of high acoustic impedance layer and low acoustic impedance layer which are alternately arranged to realize total reflection.

Figure 5C:
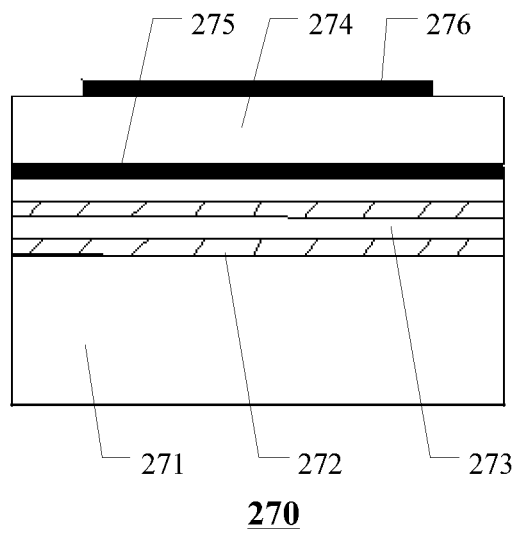
FIG. 5C is a structural schematic diagram of still another bulk acoustic wave resonator provided by an embodiment of the present disclosure.

In some examples, at least one of the M series resonators 210 and the parallel resonators 220 in the N parallel branches 120 can adopt the resonator shown in FIG. 5A, the resonator shown in FIG. 5B, or the resonator shown in FIG. 5C. Of course, the embodiments of the present disclosure include but are not limited thereto, and at least one of the M series resonators and the N parallel resonators in the parallel branches may also use other types of resonators.

Figure 5D:
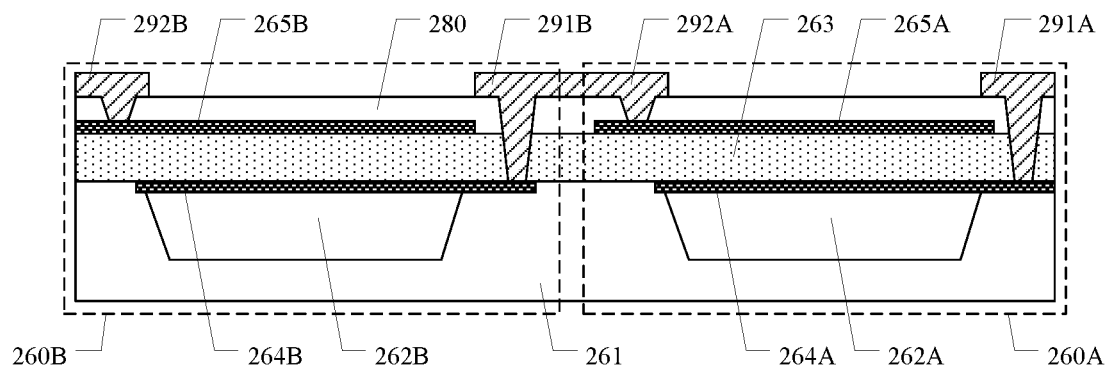
FIG. 5D is a structural schematic diagram of a bulk acoustic wave resonator connected in series provided by an embodiment of the present disclosure.

FIG. 5D is a structural schematic diagram of a bulk acoustic wave resonator connected in series provided by an embodiment of the present disclosure. As illustrated by FIG. 5D, the structure includes a first bulk acoustic wave resonator 260A and a second bulk acoustic wave resonator 260B; the first bulk acoustic wave resonator 260A includes a substrate 261, an air gap 262A located in the substrate 261, a piezoelectric film 263, and a first driving electrode 264A and a second driving electrode 265A located on two sides of the piezoelectric film 263; the second bulk acoustic wave resonator 260B includes a substrate 261, an air gap 262B in the substrate 261, a piezoelectric thin film 263, and a first driving electrode 264B and a second driving electrode 265B located on two sides of the piezoelectric film 263. The first bulk acoustic wave resonator 260A and the second bulk acoustic wave resonator 260B may share the substrate 261 and the piezoelectric thin film 263.

As illustrated by FIG. 5D, the structure may further include an insulating layer 280 and a first connection electrode 291A, a second connection electrode 292A, a third connection electrode 291B and a fourth connection electrode 292B that are located at a side of the insulating layer 280 away from the substrate 261; the first connection electrode 291A is electrically connected with the first driving electrode 264A in the first bulk acoustic wave resonator 260A through a via hole passing through the insulating layer 280 and the piezoelectric film 263, the second connection electrode 292A is electrically connected with the second driving electrode 265A in the first bulk acoustic wave resonator 260A through a via hole passing through the insulating layer 280; the third connection electrode 291B is electrically connected with the first driving electrode 264B in the second bulk acoustic wave resonator 260B through a via hole passing through the insulating layer 280 and the piezoelectric film 263, the fourth connection electrode 292B is electrically connected with the second driving electrode 265B in the second bulk acoustic wave resonator 260B through a via hole passing through the insulating layer 280. In this case, the first bulk acoustic wave resonator 260A and the second bulk acoustic wave resonator 260B can be connected in series by connecting the third connection electrode 291B and the second connection electrode 292A. In this way, any two adjacent series resonators in the series branch of the filter provided by the embodiment of the present disclosure can be connected in series in the abovementioned manner; the parallel resonator in any parallel branches of the filter can also be connected to the series resonator in the series branch in the abovementioned manner; in addition, the bridged resonators in the bridged branch can also be connected after the parallel resonators of the parallel branch in the abovementioned manner. For example, the second driving electrode of the first series resonator 211 in the series branch 110, the first driving electrode of the second series resonator 212 in the series branch 110 and the first driving electrode of the first parallel resonator 221 in the first parallel branch 121 in FIG. 4 can be connected to each other through the abovementioned connection electrodes, to realize the connection relationship as illustrated by FIG. 4.

Figure 5E:
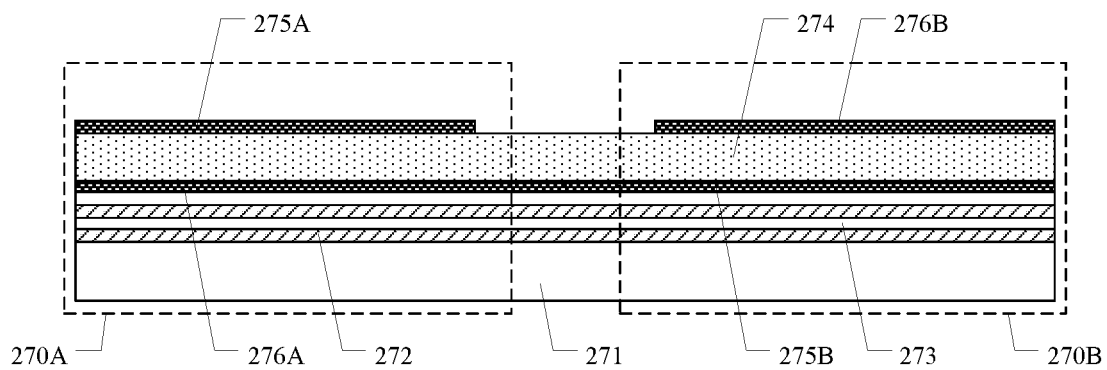
FIG. 5E is a structural schematic diagram of another bulk acoustic wave resonator connected in series provided by an embodiment of the present disclosure.

FIG. 5E is a structural schematic diagram of another bulk acoustic wave resonator connected in series provided by an embodiment of the present disclosure. As illustrated by FIG. 5E, the structure includes a third bulk acoustic wave resonator 270A and a fourth bulk acoustic wave resonator 270B; the third bulk acoustic wave resonator 270A includes a substrate 271, a plurality of high acoustic impedance layers 272 and low acoustic impedance layers 273 that are alternately arranged on the substrate 271, a piezoelectric film 274 and a first driving electrode 275A and a second driving electrode 276A located on two sides of the piezoelectric film 274; the fourth bulk acoustic wave resonator 270B includes a substrate 271, a plurality of high acoustic impedance layers 272 and low acoustic impedance layers 273 that are alternately arranged on the substrate 271, a piezoelectric film 274 and a first driving electrode 275B and a second driving electrode 276B located on two sides of the piezoelectric film 274. It can be seen that the third bulk acoustic wave resonator 270A and the fourth bulk acoustic wave resonator 270B can share the substrate 271, the plurality of high acoustic impedance layers 272 and low acoustic impedance layers 273 that are alternately arranged and the piezoelectric film 274.

As illustrated by FIG. 5E, the first driving electrode 275A of the third bulk acoustic wave resonator 270A is located at a side of the piezoelectric film 274 away from the substrate 271, the second driving electrode 276A of the third bulk acoustic wave resonator 270A is located at a side of the piezoelectric film 274 close to the substrate 271, the first driving electrode 275B of the fourth bulk acoustic wave resonator 270B is located at a side of the piezoelectric film 274 close to the substrate 271, and the second driving electrode 276B of the fourth bulk acoustic wave resonator 270B is located at a side of the piezoelectric film 274 away from the substrate 271. In this way, the second driving electrode 276A of the third bulk acoustic wave resonator 270A and the first driving electrode 275B of the fourth bulk acoustic wave resonator 270B can be arranged on a same layer, and the second driving electrode 276A and the first driving electrode 275B are electrically connected, so that a series connection between the third bulk acoustic wave resonator 270A and the fourth bulk acoustic wave resonator 270A can be realized. In this way, any two adjacent series resonators in the series branch of the filter provided by the embodiment of the present disclosure can be connected in series in the abovementioned manner; the parallel resonator in any parallel branch of the filter can also be connected to the series resonator in the series branch in the abovementioned manner; in addition, the bridged resonators in the bridged branch can also be connected after the parallel resonators of the parallel branch in the abovementioned manner. For example, the second driving electrode of the first series resonator 211 in the series branch 110, the first driving electrode of the second series resonator 212 in the series branch 110, and the first driving electrode of the first parallel resonator 221 in the first parallel branch 121 in FIG. 4 are arranged on a same layer, and are electrically connected, to realize the connection relationship as illustrated by FIG. 4.

For example, as illustrated by FIG. 5E, the second driving electrode 276A of the third bulk acoustic wave resonator 270A and the first driving electrode 275B of the fourth bulk acoustic wave resonator 270B may be integrally formed.

Figure 5F:
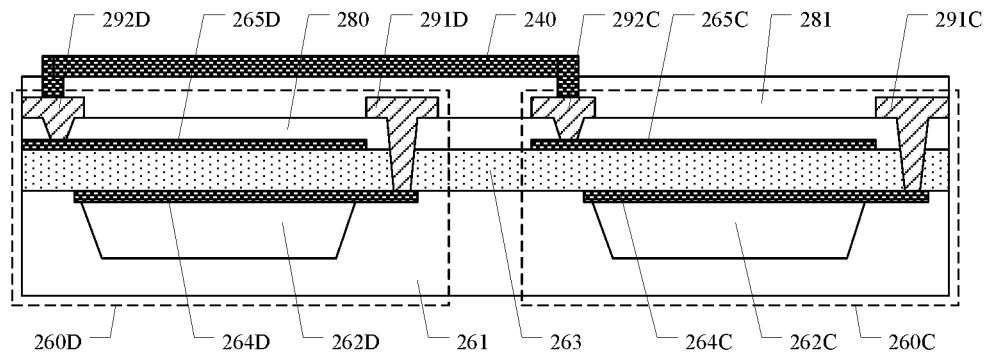
FIG. 5F is a structural schematic diagram of a connection mode between a bulk acoustic wave resonator and an inductor provided by an embodiment of the present disclosure.

FIG. 5F is a structural schematic diagram of a connection mode between a bulk acoustic wave resonator and an inductor provided by an embodiment of the present disclosure. As illustrated by FIG. 5F, the structure includes a fifth bulk acoustic wave resonator 260C, a sixth bulk acoustic wave resonator 260D and an inductor 240; the fifth bulk acoustic wave resonator 260C includes a substrate 261, an air gap 262C located in the substrate 261, a piezoelectric film 263, and a first driving electrode 264C and a second driving electrode 265C located on two sides of the piezoelectric film 263; the sixth bulk acoustic wave resonator 260D includes a substrate 261, an air gap 262D in the substrate 261, a piezoelectric thin film 263, and a first driving electrode 264D and a second driving electrode 265D on two sides of the piezoelectric thin film 263. The fifth bulk acoustic wave resonator 260C and the sixth bulk acoustic wave resonator 260D may share the substrate 261 and the piezoelectric thin film 263.

As illustrated by FIG. 5F, the structure may further include an insulating layer 280 and a fifth connection electrode 291C, a sixth connection electrode 292C, a seventh connection electrode 291D, and an eighth connection electrode 292D located at a side of the insulation layer 280 away from the substrate 261; the fifth connection electrode 291C is electrically connected with the first driving electrode 264C in the fifth bulk acoustic wave resonator 260C through a via hole passing through the insulating layer 280 and the piezoelectric film 263, the sixth connection electrode 292C is electrically connected with the second driving electrode 265C in the fifth bulk acoustic wave resonator 260C through a via hole passing through the insulating layer 280; the seventh connection electrode 291D is electrically connected with the first driving electrode 264D in the sixth bulk acoustic wave resonator 260D by passing through the insulating layer 280 and the via hole in the piezoelectric film 263, and the eighth connection electrode 292D is electrically connected with the second driving electrode 265D in the sixth bulk acoustic wave resonator 260D through a via hole passing through the insulating layer 280. In this case, the inductor 240 may be a single-layer inductor, is located at a side of the insulating layer 281 away from the substrate 261, and is respectively connected with the sixth connection electrode 292C and the eighth connection electrode 292D, and the insulating layer 281 is arranged between each of the connection electrodes and the inductor 240. In this way, the resonator and the inductor in the filter provided by the embodiment of the present disclosure can be connected in the abovementioned manner. For example, the bridged resonators of the bridged branch and the first inductor can be connected with the series resonators of the series branch in the abovementioned manner.

Figure 5G:
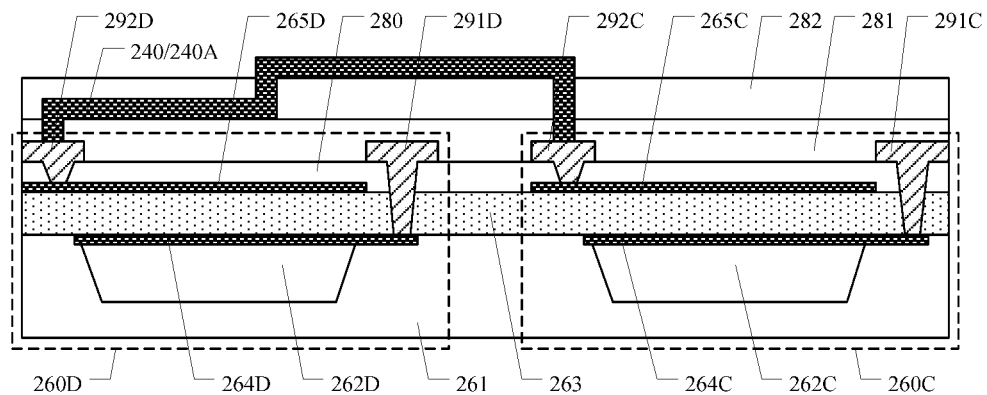
FIG. 5G is a schematic structural diagram of a connection mode between a bulk acoustic wave resonator and an inductor provided by an embodiment of the present disclosure.

FIG. 5G is a schematic structural diagram of a connection mode between a bulk acoustic wave resonator and an inductor provided by an embodiment of the present disclosure. As illustrated by FIG. 5G, different from the connection method shown in FIG. 5F, the inductor 240 can be a three-dimensional inductor, and can include a sub-conductive part 240A and a sub-conductive part 240B that are located in a plurality of film layers. The sub-conductive part 240A is located at a side of the insulating layer 281 away from the substrate 261, and the sub-conductive part 240B is located at a side of the insulating layer 282 away from the sub-conductive part 240A.

In some examples, the aforementioned piezoelectric film may include piezoelectric crystals or piezoelectric ceramics. Of course, embodiments of the present disclosure include but are not limited thereto, and the piezoelectric material layer may also be other types of piezoelectric materials.

In some examples, the abovementioned piezoelectric film can be made of aluminum nitride (AlN), doped aluminum nitride (doped ALN), zinc oxide (ZnO), lead zirconate titanate (PZT), lithium niobate (LiNbO3), one or more of quartz (Quartz), potassium niobate (KNbO3) and lithium tantalate (LiTaO3). Of course, the embodiments of the present disclosure include but are not limited thereto, the piezoelectric material layer may also be a composite piezoelectric thin film structure, such as a composite structure of lithium tantalate piezoelectric film/silicon dioxide/silicon substrate.

In some examples, as illustrated by FIG. 4, the second end 120B of the first parallel branch 120 is located between the first series resonator 210 and the second series resonator 210, the second end 120B of the jth parallel branch 120 is located between the jth series resonator 210 and the (j+1)th series resonator 210, and the second end 120B of the Nth parallel branch 120 is located between the Nth series resonator 210 away from the (N−1)th series resonator 210, in which j is a positive integer greater than 1 and less than N. It should be noted that, the order of the abovementioned parallel branches can be arranged along the direction from the input end to the output end of the filter.

In some examples, as illustrated by FIG. 4, the value of i is 1, and the values of M and N are equal. In this way, the filter has better filtering performance.

In some examples, as illustrated by FIG. 4, the filter 100 includes a series branch 110, three parallel branches 120 and a bridged branch 130. The filter 100 includes an input end 100A and an output end 100B, the series branch 110 is arranged between the input end 100A and the output end 100B, in this case the input end 100A and the output end 100B can also be regarded as two ends of the series branch 110. The series branch 110 comprises three series resonators 210 arranged in series, including a first series resonator 211, a second series resonator 212 and a third series resonator 213.

As illustrated by FIG. 4, each of the three parallel branches 120 includes a first parallel branch 121, a second parallel branch 122 and a third parallel branch 123; each of the parallel branches 120 includes a parallel resonator 220; in this case, the first parallel branch 121 includes a first parallel resonator 221, the second parallel branch 122 includes a second parallel resonator 222, and the third parallel branch 123 includes a third parallel resonator 223. Each of the parallel branches 120 includes a first end 120A and a second end 120B that are opposite to each other; the first end 120A of the first parallel branch 121 is grounded, the second end 120B of the first parallel branch 121 is connected between the first series resonator 211 and the second series resonator 212; the first end 120A of the second parallel branch 122 is grounded, the second end 120B of the second parallel branch 122 is connected between the second series resonator 212 and the third series resonator 213; the first end 120A of the third parallel branch 123 is grounded, and the second end 120B of the third parallel branch 123 is connected between the third series resonator 213 and the output end 100B.

As illustrated by FIG. 4, the bridged branch 130 includes a bridged resonator 230 and a first inductor 241; the bridged branch 130 includes a third end 130A and a fourth end 130B, the third end 130A is connected with the first end 120A of the first parallel branch 121, and the fourth end 130B is connected with the second end 120B of the third parallel branch 123.

In some examples, the inductance of the first inductor 241 ranges from 10 nH to 17 nH.

In some examples, as illustrated by FIG. 4, the series branch 110 includes an input end 100A and an output end 100B arranged opposite to each other, M series resonators 210 are arranged between the input end 100A and the output end 100B; the filter 100 further includes: a second inductor 242 arranged in parallel with the first series resonator 210. In this way, the second inductance and the capacitance of the first series resonator in parallel can form a new LC resonance peak, which can add an extra zero outside the passband of the filter, so that the out-of-band suppression is further improved.

In some examples, the inductance of the second inductor 242 ranges from 5 nH to 9 nH. Of course, embodiments of the present disclosure include but are not limited thereto.

In some examples, in the case that the inductance of the second inductor 242 ranges from 5 nH to 9 nH, the inductance of the first inductor 241 ranges from 10 nH to 17 nH. Of course, embodiments of the present disclosure include but are not limited thereto.

Figure 5H:
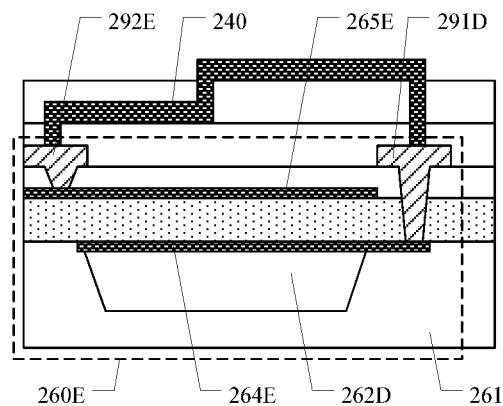
FIG. 5H is a schematic diagram of a resonator in parallel with an inductor provided in an embodiment of the present disclosure.

FIG. 5H is a schematic diagram of a resonator in parallel with an inductor provided in an embodiment of the present disclosure. As illustrated by FIG. 5H, the structure includes a seventh bulk acoustic wave resonator 260E and an inductor 240; the seventh bulk acoustic wave resonator 260E includes a substrate 261, an air gap 262C located in the substrate 261, a piezoelectric film 263, and a first driving electrode 264E and a second driving electrode 265E located on two sides of the piezoelectric film 263; the inductor 240 may be a three-dimensional inductor, and may include sub-conductive parts located in multiple film layers (for specific description, please refer to the related description of FIG. 5G). The structure may further include a ninth connection electrode 291E and a tenth connection electrode 292E; the ninth connection electrode 291E is connected with the first driving electrode 264E, the tenth connection electrode 292E is connected with the second driving electrode 265E; one end of the inductor 240 is connected with the ninth connection electrode 191D, the other end is connected to the tenth connection electrode 292D, so that a parallel connection of the inductor 240 and the seventh bulk acoustic wave resonator 260E is realized.

For example, the second inductor 242 and the first series resonator 210 in the filter shown in FIG. 4 can be arranged in parallel in the abovementioned manner.

In some examples, as illustrated by FIG. 4, in the filter, the value of i is 1, and the value of k is 2.

Figure 6:
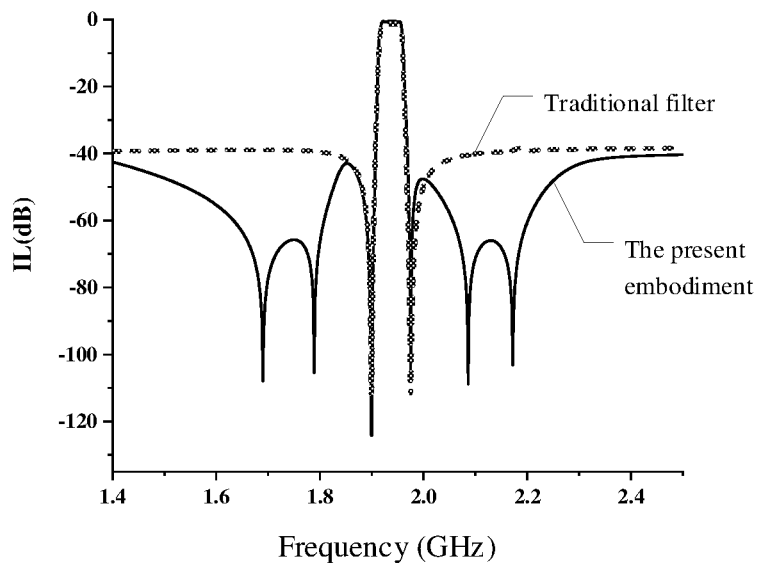
FIG. 6 is a comparison diagram of transmission coefficients of a filter provided by an embodiment of the present disclosure and a traditional bulk acoustic wave filter in a wide frequency range.
Figure 7:
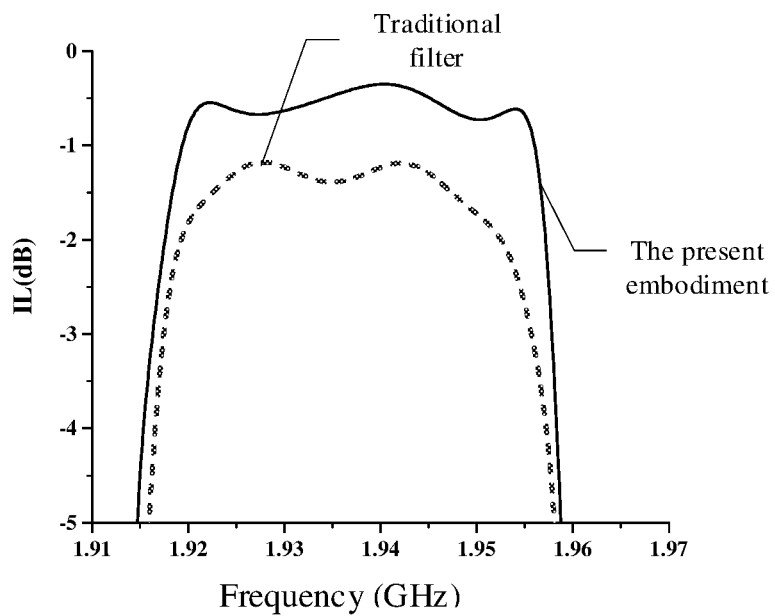
FIG. 7 is a comparison diagram of transmission coefficients at a center frequency range between a filter provided by an embodiment of the present disclosure and a traditional bulk acoustic wave filter.

FIG. 6 is a comparison diagram of transmission coefficients of a filter provided by an embodiment of the present disclosure and a traditional bulk acoustic wave filter in a wide frequency range; and FIG. 7 is a comparison diagram of transmission coefficients at a center frequency range between a filter provided by an embodiment of the present disclosure and a traditional bulk acoustic wave filter. As illustrated by FIG. 6 and FIG. 7, the insertion loss of this filter is about 0.83 dB better than that of the traditional bulk acoustic wave filter; and from 1.9 GHZ to 1.98 GHz and from 1.98 GHz to 2.5 GHZ, the out-of-band suppression of this filter is significantly improved.

Of course, the embodiments of the present disclosure include but are not limited thereto, and the filter may not be arranged with the abovementioned second inductor.

Figure 8:
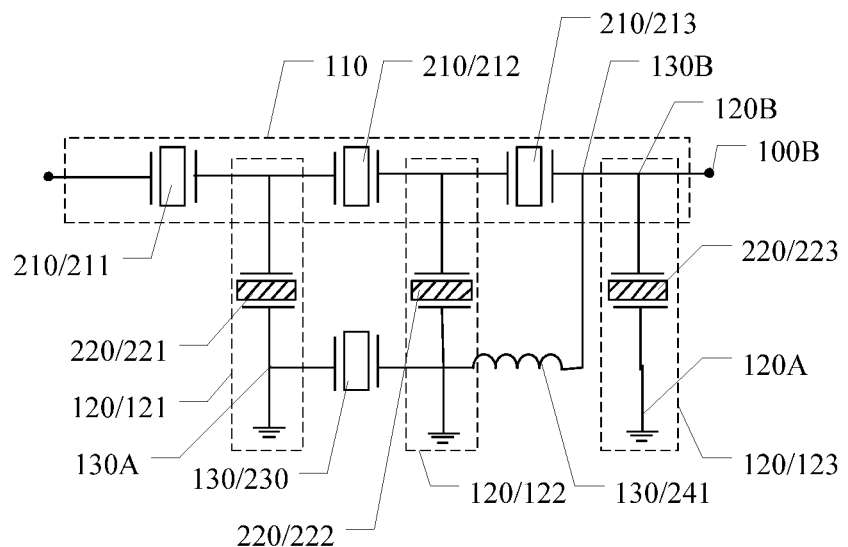
FIG. 8 is a schematic diagram of another filter provided by an embodiment of the present disclosure.

FIG. 8 is a schematic diagram of another filter provided by an embodiment of the present disclosure. As illustrated by FIG. 8, the filter 100 includes the series branch 110, the parallel branch 120 and the bridged branch 130 mentioned above.

As illustrated by FIG. 8, the series branch 110 includes three series resonators 210 arranged in series, including a first series resonator 211, a second series resonator 212 and a third series resonator 213. Each of the three parallel branches 120 includes a first parallel branch 121, a second parallel branch 122 and a third parallel branch 123; each of the parallel branches 120 includes a parallel resonator 220; in this case, the first parallel branch 121 includes a first parallel resonator 221, the second parallel branch 122 includes a second parallel resonator 222, and the third parallel branch 123 includes a third parallel resonator 223. Each parallel branch 120 includes a first end 120A and a second end 120B that are opposite to each other; the first end 120A of the first parallel branch 121 is grounded, the second end 120B of the first parallel branch 121 is connected between the first series resonator 211 and the second series resonator 212; the first end 120A of the second parallel branch 122 is grounded, the second end 120B of the second parallel branch 122 is connected between the second series resonator 212 and the third series resonator 213; the first end 120A of the third parallel branch 123 is grounded, and the second end 120B of the third parallel branch 123 is connected between the third series resonator 213 and the output end 100B.

As illustrated by FIG. 8, the third end 130A of the bridged branch 130 is connected to the first end 120A of the first parallel branch 121, and the fourth end 130B of the bridged branch 130 is connected with the second end 120B of the third parallel branch 123.

Figure 9:
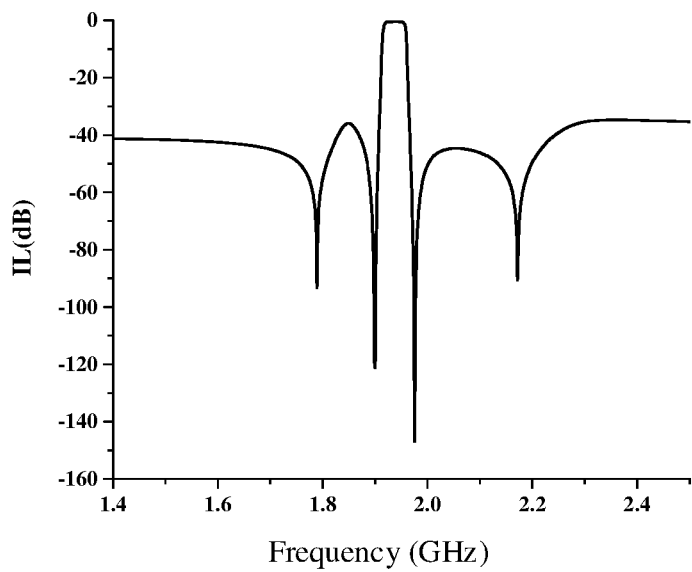
FIG. 9 is a curve schematic diagram of transmission coefficients of another filter in a wide frequency range provided by an embodiment of the present disclosure.
Figure 10:
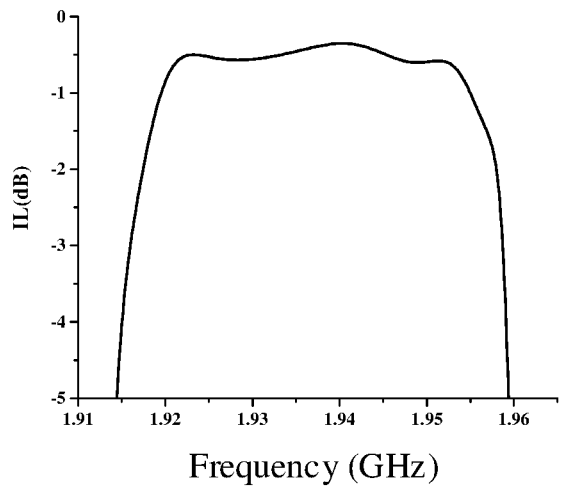
FIG. 10 is a curve schematic diagram of transmission coefficients at a center frequency range of another filter provided by an embodiment of the present disclosure.

FIG. 9 is a curve schematic diagram of transmission coefficients of another filter in a wide frequency range provided by an embodiment of the present disclosure; and FIG. 10 is a curve schematic diagram of transmission coefficients at a center frequency range of another filter provided by an embodiment of the present disclosure. As illustrated by FIG. 9 and FIG. 10, because the bridged resonator and the first inductor are connected in series and then bridged between the first end of the first parallel branch and the second end of the third parallel branch, the introduction of the bridged resonator adds two zeros in the passband, the value of the first inductance can move the two zeros to a suitable position outside the passband, to increase the out-of-band suppression, and the bridged resonator simultaneously play a role of optimizing the impedance matching of the input end and the output end, so that the insertion loss is reduced. In this way, the filter can simultaneously reduce insertion loss and improve out-of-band suppression performance.

Figure 11:
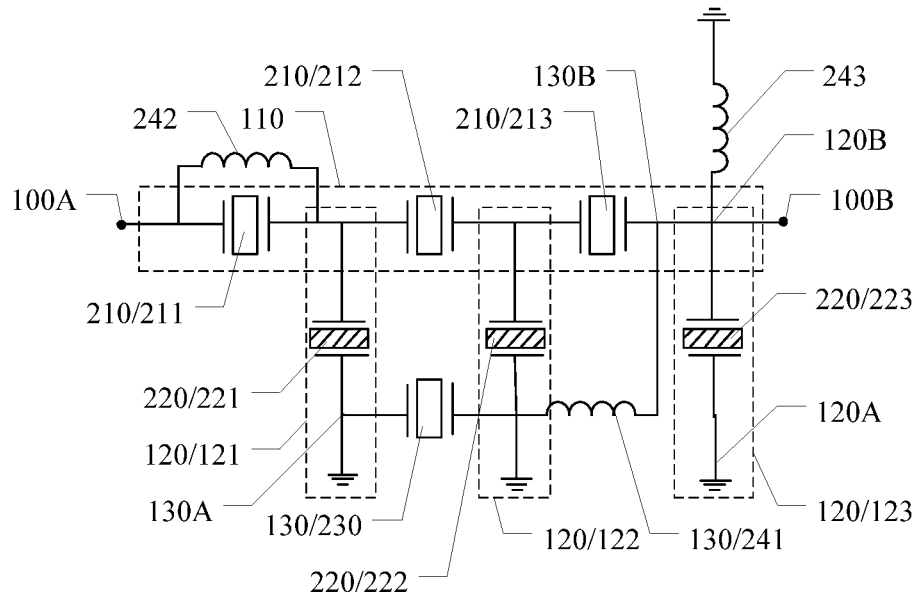
FIG. 11 is a schematic diagram of another filter provided by an embodiment of the present disclosure.

FIG. 11 is a schematic diagram of another filter provided by an embodiment of the present disclosure. As illustrated by FIG. 11, the filter 100 includes a series branch 110, a parallel branch 120, a bridged branch 130 and a second inductor 242 that are mentioned above. The series branch 110 includes three series resonators 210 arranged in series, which includes a first series resonator 211, a second series resonator 212 and a third series resonator 213. Three of the parallel branches 120 include a first parallel branch 121, a second parallel branch 122 and a third parallel branch 123; each of the parallel branches 120 includes a parallel resonator 220; in this case, the first parallel branch 121 includes a first parallel resonator 221, the second parallel branch 122 includes a second parallel resonator 222, the third parallel branch 123 includes a third parallel resonator 223. Each of the parallel branches 120 includes a first end 120A and a second end 120B that are opposite to each other; the first end 120A of the first parallel branch 121 is grounded, the second end 120B of the first parallel branch 121 is connected between the first series resonator 211 and the second series resonator 212; the first end 120A of the second parallel branch 122 is grounded, the second end 120B of the second parallel branch 122 is connected between the second series resonator 212 and the third series resonator 213; and the first end 120A of the third parallel branch 123 is grounded, the second end 120B of the third parallel branch 123 is connected between the third series resonator 213 and the output end 100B.

As illustrated by FIG. 11, the third end 130A of the bridged branch 130 is connected with the first end 120A of the first parallel branch 121, the fourth end 130B of the bridged branch 130 is connected with the second end 120B of the third parallel branch 123; the second inductor 242 is arranged in parallel with the first series resonator 211. In addition, the filter 100 also includes a third inductor 243; one end of the third inductor 243 is grounded, and the other end of the third inductor 243 is connected with the output end 100B. In this way, the introduction of the grounded third inductor 243 can improve the impedance matching in the passband.

Figure 12:
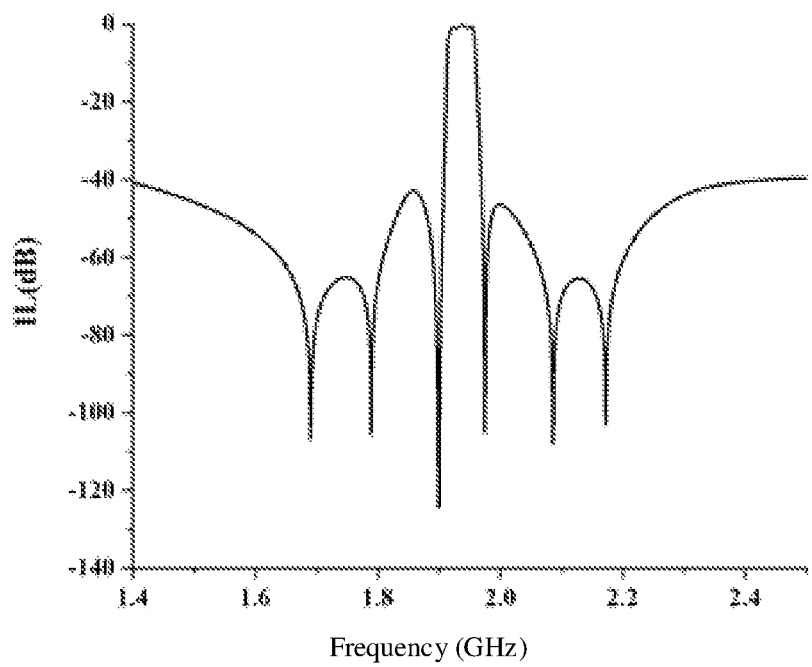
FIG. 12 is a schematic diagram of transmission coefficients of another filter in a wide frequency range provided by an embodiment of the present disclosure.
Figure 13:
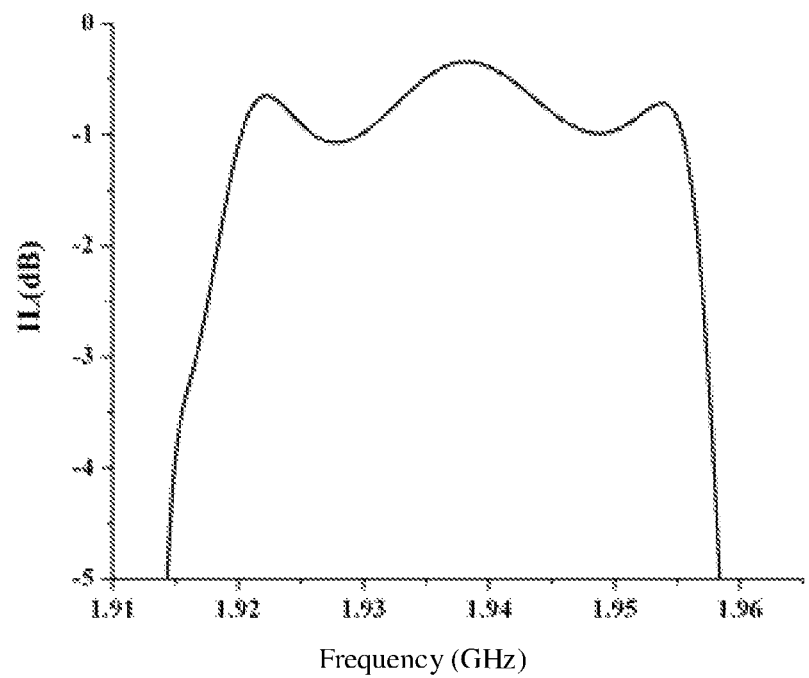
FIG. 13 is a schematic diagram of transmission coefficients at a center frequency range of another filter provided by an embodiment of the present disclosure.

FIG. 12 is a schematic diagram of transmission coefficients of another filter in a wide frequency range provided by an embodiment of the present disclosure; and FIG. 13 is a schematic diagram of transmission coefficients at a center frequency range of another filter provided by an embodiment of the present disclosure. As illustrated by FIG. 12 and FIG. 13, the filter achieves 60 dB of out-of-band suppression from 1.64 GHz to 1.81 GHZ and from 2.06 GHz to 2.2 GHz.

In some examples, the inductance of the abovementioned third inductor ranges from 10 nH to 17 nH. Of course, embodiments of the present disclosure include but are not limited thereto.

Figure 14:
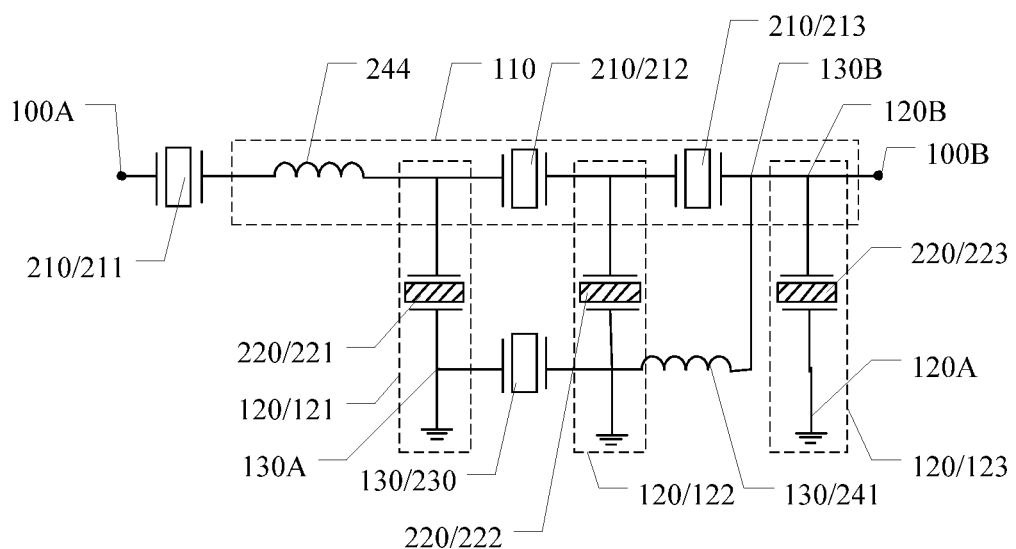
FIG. 14 is a schematic diagram of another filter provided by an embodiment of the present disclosure.

FIG. 14 is a schematic diagram of another filter provided by an embodiment of the present disclosure. As illustrated by FIG. 14, the filter 100 includes a series branch 110, a parallel branch 120 and a bridged branch 130 that are mentioned above. The series branch 110 comprises three series resonators 210 arranged in series, including a first series resonator 211, a second series resonator 212 and a third series resonator 213. Three of the parallel branches 120 include a first parallel branch 121, a second parallel branch 122 and a third parallel branch 123; each of the parallel branches 120 includes a parallel resonator 220; in this case, the first parallel branch 121 includes a first parallel resonator 221, the second parallel branch 122 includes a second parallel resonator 222, and the third parallel branch 123 includes a third parallel resonator 223. Each of the parallel branches 120 includes a first end 120A and a second end 120B that are opposite to each other; the first end 120A of the first parallel branch 121 is grounded, the second end 120B of the first parallel branch 121 is connected between the first series resonator 211 and the second series resonator 212; the first end 120A of the second parallel branch 122 is grounded, the second end 120B of the second parallel branch 122 is connected between the second series resonator 212 and the third series resonator 213; the first end 120A of the third parallel branch 123 is grounded, and the second end 120B of the third parallel branch 123 is connected between the third series resonator 213 and the output end 100B.

As illustrated by FIG. 14, the third end 130A of the bridged branch 130 is connected with the first end 120A of the first parallel branch 121, and the fourth end 130B of the bridged branch 130 is connected with the second end 120B of the third parallel branch 123. In addition, the filter 100 also includes a fourth inductor 244; the fourth inductor 244 is arranged in series between the first series resonator 211 and the second end 120B of the first parallel branch 121. In this way, by connecting the fourth inductor 244 in series between the first series resonator 211 and the second end 120B of the first parallel branch 121, the impedance matching in the passband can be improved, so that the in-band fluctuation of the filter is smoother.

Figure 15:
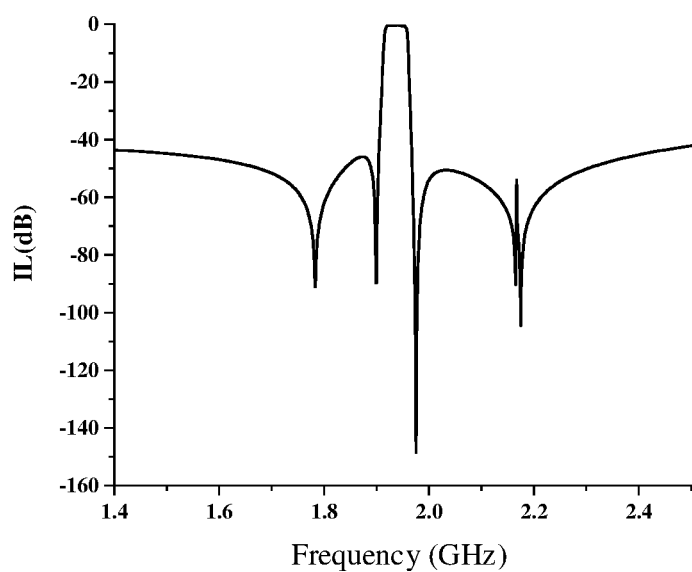
FIG. 15 is a curve schematic diagram of transmission coefficients of another filter in a wide frequency range provided by an embodiment of the present disclosure.
Figure 16:
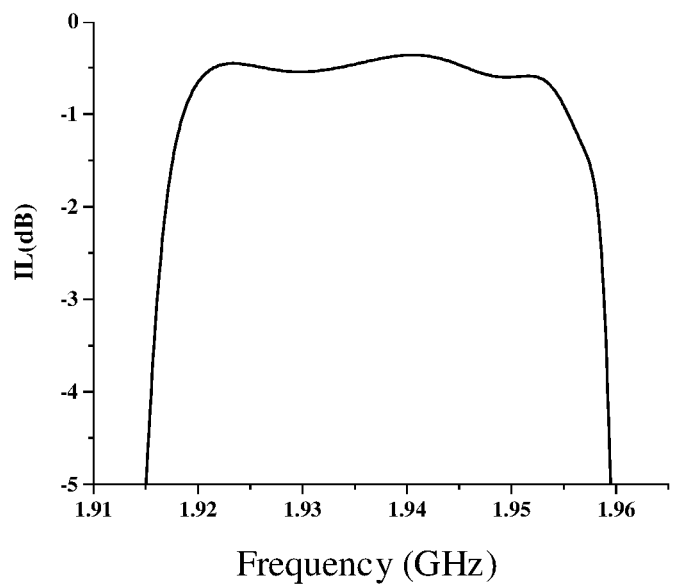
FIG. 16 is a curve schematic diagram of transmission coefficients at a center frequency range of another filter provided by an embodiment of the present disclosure.

FIG. 15 is a curve schematic diagram of transmission coefficients of another filter in a wide frequency range provided by an embodiment of the present disclosure; and FIG. 16 is a curve schematic diagram of transmission coefficients at a center frequency range of another filter provided by an embodiment of the present disclosure. As illustrated by FIG. 15 and FIG. 16, the in-band fluctuation of the filter is smoother.

In some examples, the abovementioned fourth inductor has an inductance ranging from 0.3 nH to 0.7 nH. Of course, the embodiments of the present disclosure include but are not limited thereto.

In some examples, in the case that the abovementioned fourth inductor has an inductance value from 0.3 nH to 0.7 nH, the range of the inductance value of the first inductor may be from 11 nH to 18 nH. Of course, the embodiments of the present disclosure include but are not limited thereto.

Figure 17:
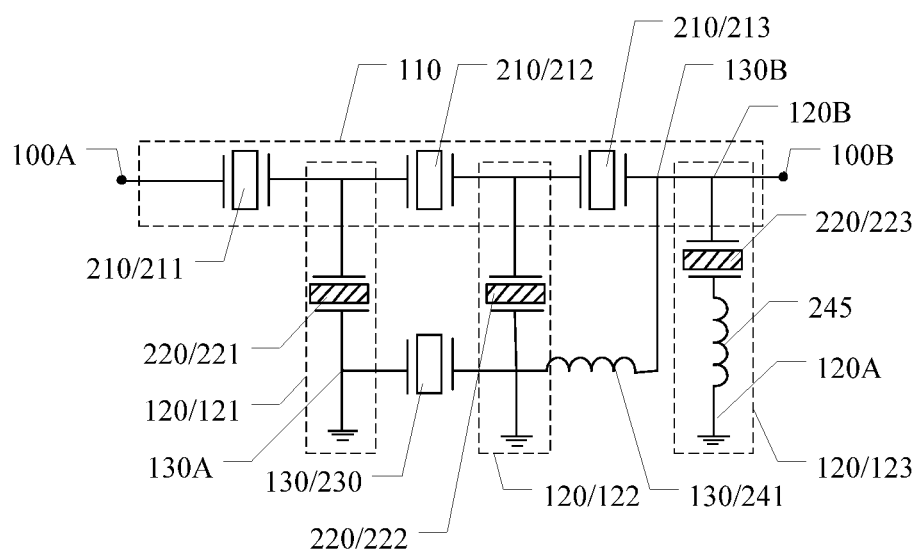
FIG. 17 is a schematic diagram of another filter provided by an embodiment of the present disclosure.

FIG. 17 is a schematic diagram of another filter provided by an embodiment of the present disclosure. As illustrated by FIG. 17, the filter 100 includes a series branch 110, a parallel branch 120 and a bridged branch 130 that are mentioned above. The series branch 110 comprises three series resonators 210 arranged in series, including a first series resonator 211, a second series resonator 212 and a third series resonator 213. Three of the parallel branches 120 include a first parallel branch 121, a second parallel branch 122 and a third parallel branch 123; each of the parallel branches 120 includes a parallel resonator 220; in this case, the first parallel branch 121 includes a first parallel resonator 221, the second parallel branch 122 includes a second parallel resonator 222, the third parallel branch 123 includes a third parallel resonator 223. Each of the parallel branches 120 includes a first end 120A and a second end 120B that are opposite to each other; the first end 120A of the first parallel branch 121 is grounded, the second end 120B of the first parallel branch 121 is connected between the first series resonator 211 and the second series resonator 212; the first end 120A of the second parallel branch 122 is grounded, the second end 120B of the second parallel branch 122 is connected between the second series resonator 212 and the third series resonator 213; and the first end 120A of the third parallel branch 123 is grounded, and the second end 120B of the third parallel branch 123 is connected between the third series resonator 213 and the output end 100B.

As illustrated by FIG. 17, the third end 130A of the bridged branch 130 is connected with the first end 120A of the first parallel branch 121, the fourth end 130B of the bridged branch 130 is connected with the second end 120B of the third parallel branch 123. In addition, the filter 100 also includes a fifth inductor 245; the fifth inductor 245 is arranged in series between the first end 120A of the third parallel branch 123 and the third parallel resonator 223. In this way, based on the idea of reducing circuit complexity, compared to the filter shown in FIG. 13, the filter removes the inductance in series next to the first series resonator, and introduces a fifth inductance in series between the first end of the third parallel branch and the third parallel resonator, because the parallel arm resonator is capacitive outside the passband frequency of the filter, can form a new LC resonance with the fifth inductor, a new zero can be formed outside the band, by adjusting the value of the inductance of the fifth inductor, a new zero point can basically coincide with the zero point introduced by the bridged resonator, in this case, the out-of-band suppression effect is optimal, and an out-of-band suppression level of 40 dB can be achieved.

Figure 18:
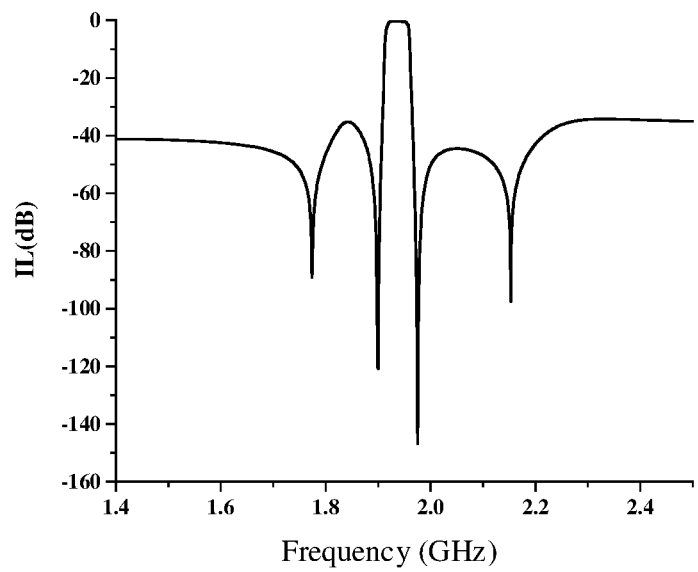
FIG. 18 is a curve schematic diagram of transmission coefficients of another filter in a wide frequency range provided by an embodiment of the present disclosure.
Figure 19:
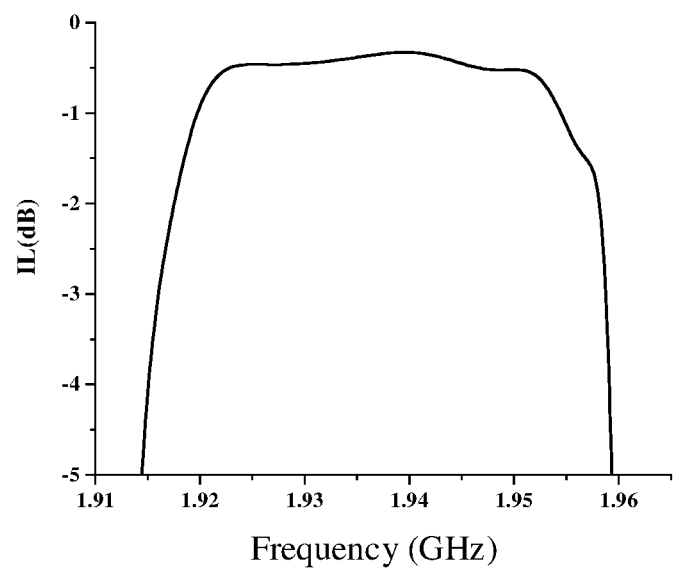
FIG. 19 is a curve diagram of transmission coefficients at a center frequency range of another filter provided by an embodiment of the present disclosure.

FIG. 18 is a curve schematic diagram of transmission coefficients of another filter in a wide frequency range provided by an embodiment of the present disclosure; and FIG. 19 is a curve diagram of transmission coefficients at a center frequency range of another filter provided by an embodiment of the present disclosure. As illustrated by FIG. 18 and FIG. 19, the filter allows the new zero to substantially coincide with the zero introduced across the resonator, in this case, the out-of-band suppression effect is optimal, and an out-of-band suppression level of 40 dB can be achieved.

In some examples, the value range of the inductance of the abovementioned fifth inductor is from 4.5 nH to 6.5 nH. Of course, embodiments of the present disclosure include but are not limited thereto.

In some examples, in the case that the abovementioned fifth inductor has an inductance value from 4.5 nH to 6.5 nH, the value range of the inductance of the first inductor may be from 10 nH to 17 nH. Of course, the embodiments of the present disclosure include but are not limited thereto.

Figure 20:
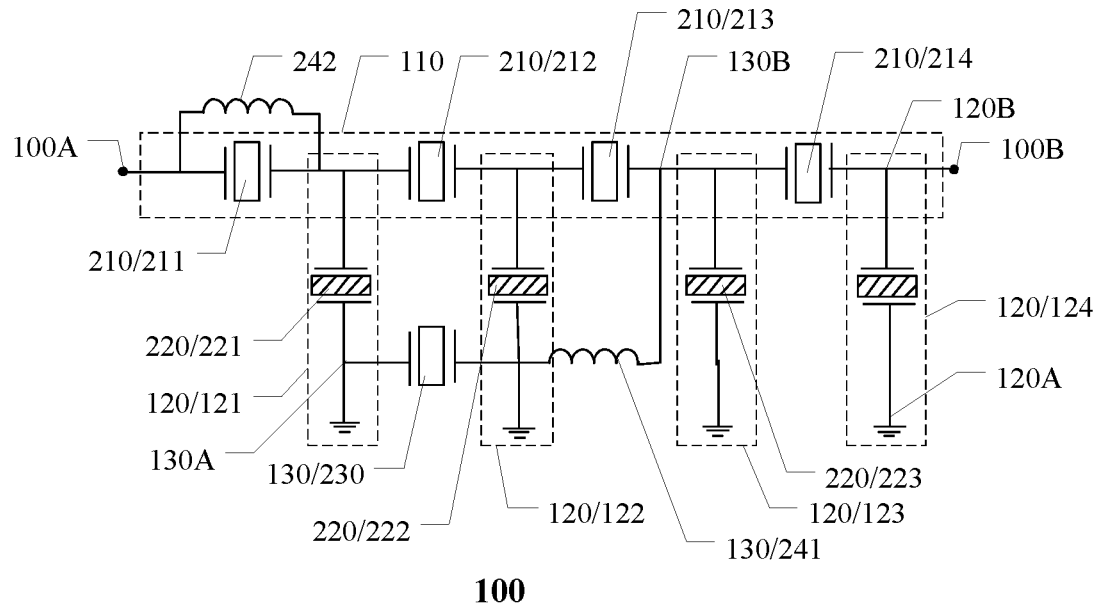
FIG. 20 is a schematic diagram of another filter provided by an embodiment of the present disclosure.

FIG. 20 is a schematic diagram of another filter provided by an embodiment of the present disclosure. As illustrated by FIG. 20, the filter 100 includes a series branch 110, four parallel branches 120, a bridged branch 130 and a second inductor 242.

The series branch 110 includes four series resonators 210 arranged in series, including a first series resonator 211, a second series resonator 212, a third series resonator 213 and a fourth series resonator 214. Four of the parallel branches 120 includes a first parallel branch 121, a second parallel branch 122, a third parallel branch 123 and a fourth parallel branch 124; each of the parallel branches 120 includes a parallel resonator 220; in this case, the first parallel branch 121 includes a first parallel resonator 221, the second parallel branch 122 includes a second parallel resonator 222, the third parallel branch 123 includes a third parallel resonator 223, and the fourth parallel branch 124 includes a fourth parallel resonator 224. Each of the parallel branches 120 includes a first end 120A and a second end 120B that are opposite to each other; the first end 120A of the first parallel branch 121 is grounded, the second end 120B of the first parallel branch 121 is connected between the first series resonator 211 and the second series resonator 212; the first end 120A of the second parallel branch 122 is grounded, the second end 120B of the second parallel branch 122 is connected between the second series resonator 212 and the third series resonator 213; the first end 120A of the third parallel branch 123 is grounded, the second end 120B of the third parallel branch 123 is connected between the third series resonator 213 and the fourth series resonator 214; the second end 120B of the fourth parallel branch 124 is connected between the fourth series resonator 214 and the output end 100B.

As illustrated by FIG. 20, the third end 130A of the bridged branch 130 is connected with the first end 120A of the first parallel branch 121, the fourth end 130B of the bridged branch 130 is connected with the second end 120B of the third parallel branch 123. The second inductor 242 is arranged in parallel with the first series resonator 211. In this way, the static capacitance of the second inductance and the first series resonator arranged in parallel can form a new LC resonance peak, which adds an extra zero outside the passband of the filter, so that the out-of-band suppression is improved. In addition, compared to the filter shown in FIG. 4, the filter has a 4-step topology structure, to achieve better out-of-band suppression.

It is worth noting that the filters provided by the embodiments of the present disclosure include but are not limited to the abovementioned 3-step topology structure and 4-step topology structure, which can also include a higher stepped topology structure. The newly added series resonator and the parallel branch can be referred to the arrangement of the fourth series resonator and the fourth parallel branch.

Figure 21:
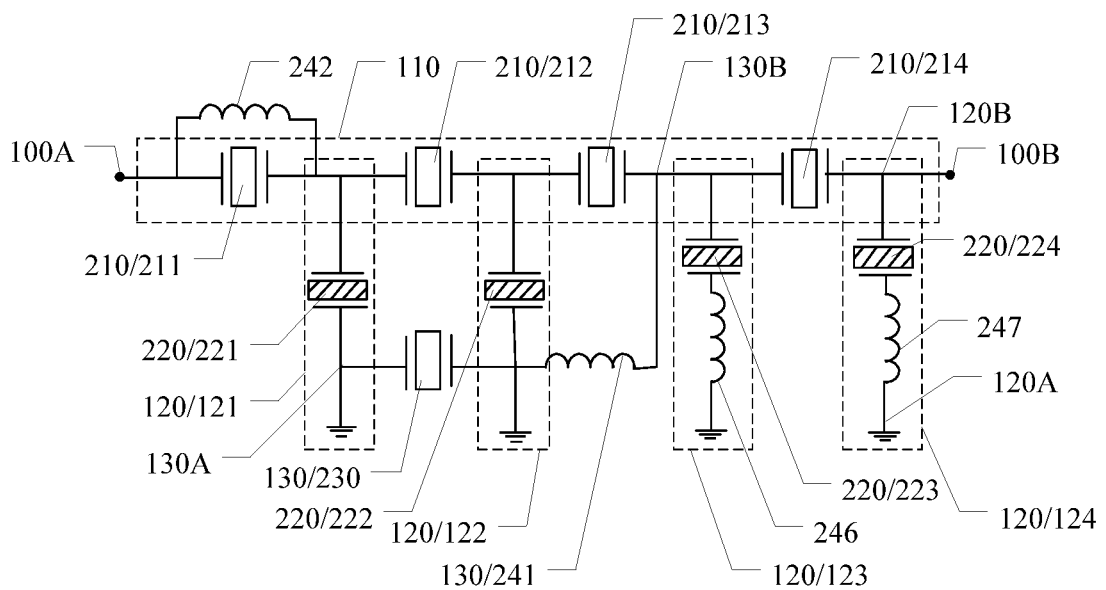
FIG. 21 is a schematic diagram of still another filter provided by an embodiment of the present disclosure.

FIG. 21 is a schematic diagram of another filter provided by an embodiment of the present disclosure. As illustrated by FIG. 21, the filter 100 includes a series branch 110, four parallel branches 120, a bridged branch 130 and a second inductor 242. Different from the filter shown in FIG. 20, the filter further includes a sixth inductor 246 and a seventh inductor 247. The sixth inductor 246 is arranged in series between the first end 120A of the third parallel branch 123 and the third parallel resonator 223; and the seventh inductor 257 is arranged in series between the first end 120A of the fourth parallel branch 124 and the fourth parallel resonator 224. Because the parallel arm resonator is capacitive outside the passband frequency of the filter, the third parallel resonator can form a new LC resonance with the sixth inductor, and the fourth parallel resonator forms a new LC resonance with the seventh inductor, so that a new zero can be formed outside the band; and by adjusting the inductance values of the sixth inductance and the seventh inductance, a new zero point can basically coincide with the zero point introduced by the bridged resonator, in this case, the out-of-band suppression effect is optimal, and an out-of-band suppression level of 40 dB can be achieved.

Figures 22, 23, 24:
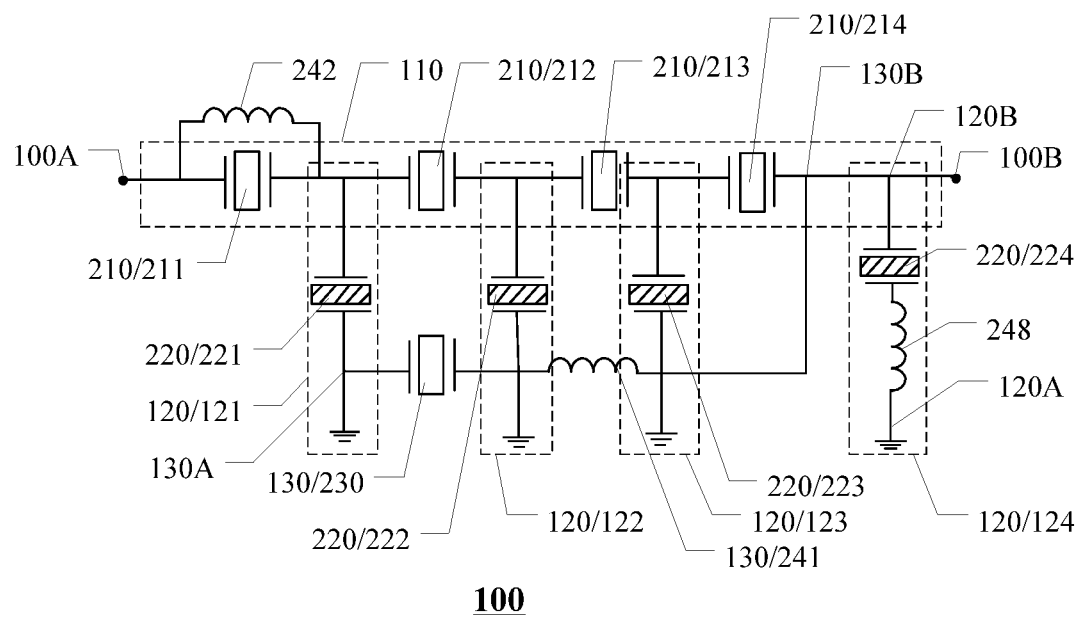
FIG. 22 is a schematic diagram of still another filter provided by an embodiment of the present disclosure.
FIG. 23 is a schematic diagram of a radio frequency device provided by an embodiment of the present disclosure.
FIG. 24 is a schematic diagram of an electronic apparatus provided by an embodiment of the present disclosure.

FIG. 22 is a schematic diagram of another filter provided by an embodiment of the present disclosure. As illustrated by FIG. 22, the filter 100 includes a series branch 110, four parallel branches 120, a bridged branch 130 and a second inductor 242. The difference from the filter shown in FIG. 20 is that the third end 130A of the bridged branch 130 is connected with the first end 120A of the first parallel branch 121, the fourth end 130B of the bridged branch 130 is connected with the second end 120B of the fourth parallel branch 124; that is, the third end 130A of the bridged branch 130 is connected with the side of the parallel resonator 220 in the first parallel branch 121 away from the series branch 110, the fourth end 130B of the bridged branch 130 is connected with the position where the fourth parallel branch 124 is connected with the series branch 110. In this way, the bridged branch can bridge three parallel branches. Of course, the embodiments of the present disclosure include but are not limited thereto, and the bridged branch may also be bridged with more parallel branches.

In the filter provided by the example, the bridged resonator and the first inductor are connected in series and then bridged between the first end of the first parallel branch and the second end of the fourth parallel branch, the introduction of the bridged resonator adds two zeros in the passband, the value of the first inductance can move the two zeros to a suitable position outside the passband, to increase out-of-band suppression, and at the same time, the bridged resonator play a role of optimizing the impedance matching of the input end and the output end, so that the insertion loss is reduced. In this way, the filter can simultaneously reduce insertion loss and improve out-of-band suppression performance.

At least one embodiment of the present disclosure further provides a radio frequency device. FIG. 23 is a schematic diagram of a radio frequency device provided by an embodiment of the present disclosure. As illustrated by FIG. 23, the radio frequency device 300 includes any one of the above-mentioned filters. Because the filter can simultaneously reduce insertion loss and improve out-of-band suppression performance, the radio frequency device including the filter has better performance.

In some examples, the aforementioned radio frequency device includes but is not limited to a radio frequency front-end module.

At least one embodiment of the present disclosure also provides an electronic apparatus. FIG. 24 is a schematic diagram of an electronic apparatus provided by an embodiment of the present disclosure. As illustrated by FIG. 24, the electronic apparatus 500 includes the aforementioned radio frequency device 300. The electronic apparatus also has higher performance and lower cost.

In some examples, the aforementioned electronic apparatuses may be terminal products such as smart phones, WIFI, and drones.

The following points required to be explained:

(1) the drawings of the embodiments of the present disclosure only relate to the structures related to the embodiments of the present disclosure, and other structures can refer to the general design.

(2) without conflict, the embodiments of the present disclosure and the features in the embodiments may be combined with each other.

The above is only the specific embodiment of this disclosure, but the protection scope of the present disclosure is not limited thereto. Any person familiar with the technical field can easily think of changes or substitutions within the technical scope disclosed in the present disclosure, and they should be included in the protection scope of the present disclosure. Therefore, the scope of protection of the present disclosure should be based on the scope of protection of the claims.

The invention claimed is:

1. A filter, comprising:
a series branch, comprising M series resonators arranged in series;
N parallel branches, each of the N parallel branches comprising a parallel resonator; and
a bridged branch, comprising a bridged resonator and a first inductor,
wherein each of the parallel branches comprises a first end and a second end that are opposite to each other, the first end of each of the parallel branches is grounded, the second end of each of the parallel branches is connected with the series branch,
the bridged branch comprises a third end and a fourth end, the third end is located at a side of the bridged resonator away from the first inductor, the fourth end is located at a side of the first inductor away from the bridged resonator, the third end is connected to the first end of the ith parallel branch, the fourth end is connected to the second end of the (i+k)th parallel branch, both M and N are positive integers greater than or equal to 3, i is a positive integer greater than or equal to 1 and less than or equal to N−k, and k is a positive integer greater than or equal to 2,
the second end of the first parallel branch is located between the first series resonator and the second series resonator, the second end of the ith parallel branch is located between the jth series resonator and the (j+1)th series resonator, the second end of the Nth parallel branch is located between the Nth series resonator away from the (N−1)th series resonator, and j is a positive integer greater than 1 and less than N.

2. The filter according to claim 1, wherein the value of k is 2.

3. The filter according to claim 1, wherein the value of i is 1, and the values of M and N are equal.

4. A filter, comprising:
a series branch, comprising M series resonators arranged in series;
N parallel branches, each of the N parallel branches comprising a parallel resonator; and
a bridged branch, comprising a bridged resonator and a first inductor,
wherein each of the parallel branches comprises a first end and a second end that are opposite to each other, the first end of each of the parallel branches is grounded, the second end of each of the parallel branches is connected with the series branch,
the bridged branch comprises a third end and a fourth end, the third end is located at a side of the bridged resonator away from the first inductor, the fourth end is located at a side of the first inductor away from the bridged resonator, the third end is connected to the first end of the ith parallel branch, the fourth end is connected to the second end of the (i+k)th parallel branch, both M and N are positive integers greater than or equal to 3, i is a positive integer greater than or equal to 1 and less than or equal to N−k, and k is a positive integer greater than or equal to 2,
wherein the series branch comprises an input end and an output end that are arranged opposite to each other, the M series resonators are arranged between the input end and the output end, the filter further comprises:
a second inductor, wherein the second inductor is arranged in parallel with the first series resonator.

5. The filter according to claim 4, wherein a value range of an inductance of the second inductor is from 5 nH to 9 nH.

6. The filter according to claim 4, further comprising:
a third inductor, wherein one end of the third inductor is grounded, and the other end of the third inductor is connected with the output end.

7. The filter according to claim 1, wherein the series branch comprises an input end and an output end that are arranged opposite to each other, the M series resonators are arranged between the input end and the output end, the filter further comprises:
a fourth inductor, the fourth inductor is arranged in series between the first series resonator and the second end of the first parallel branch.

8. The filter according to claim 1, wherein the filter further comprises:
a fifth inductor, the fifth inductor is arranged in series between the first end of the Nth parallel branch and the parallel resonator.

9. The filter according to claim 1, wherein at least one of the M series resonators and the parallel resonators in the N parallel branches is a bulk acoustic wave resonator.

10. A filter, comprising:
a series branch, comprising M series resonators arranged in series;
N parallel branches, each of the N parallel branches comprising a parallel resonator; and
a bridged branch, comprising a bridged resonator and a first inductor,
wherein each of the parallel branches comprises a first end and a second end that are opposite to each other, the first end of each of the parallel branches is grounded, the second end of each of the parallel branches is connected with the series branch,
the bridged branch comprises a third end and a fourth end, the third end is located at a side of the bridged resonator away from the first inductor, the fourth end is located at a side of the first inductor away from the bridged resonator, the third end is connected to the first end of the ith parallel branch, the fourth end is connected to the second end of the (i+k)th parallel branch, both M and N are positive integers greater than or equal to 3, i is a positive integer greater than or equal to 1 and less than or equal to N−k, and k is a positive integer greater than or equal to 2,
wherein the bulk acoustic wave resonator comprises:
a substrate;
a piezoelectric film;
a first driving electrode; and
a second driving electrode.

11. The filter according to claim 10, wherein the M series resonators comprise a first bulk acoustic wave resonator and a second bulk acoustic wave resonator, the first bulk acoustic wave resonator and the second bulk acoustic wave resonator adopt a structure of the bulk acoustic wave resonator,
the filter further comprises an insulating layer and a first connection electrode, a second connection electrode, a third connection electrode and a fourth connection electrode that are located at a side of the insulating layer away from the substrate, the first connection electrode is electrically connected with the first driving electrode of the first bulk acoustic wave resonator through a via hole in the insulating layer and the piezoelectric film, the second connection electrode is electrically connected with the second driving electrode of the first bulk acoustic wave resonator through a via hole in the insulating layer, the third connection electrode is electrically connected with the first driving electrode of the second bulk acoustic wave resonator through a via hole in the insulating layer and the piezoelectric film, and the fourth connection electrode is connected with the second driving electrode of the second bulk acoustic wave resonator through a via hole in the insulating layer, and the third connection electrode is connected with the second connection electrode to connect the first bulk acoustic wave resonator and the second bulk acoustic wave resonator in series.

12. The filter according to claim 10, wherein the ith parallel branch comprises a first bulk acoustic wave resonator, the bridged resonator comprises a second bulk acoustic wave resonator, the first bulk acoustic wave resonator and the second bulk acoustic wave resonator adopt a structure of the bulk acoustic wave resonator, the filter further comprises an insulating layer and a first connection electrode, a second connection electrode, a third connection electrode and a fourth connection electrode that are located at a side of the insulating layer away from the substrate, the first connection electrode is electrically connected with the first driving electrode of the first bulk acoustic wave resonator through a via hole in the insulating layer and the piezoelectric film, the second connection electrode is electrically connected with the second driving electrode of the first bulk acoustic wave resonator through a via hole in the insulating layer, the third connection electrode is electrically connected with the first driving electrode of the second bulk acoustic wave resonator through a via hole in the insulating layer and the piezoelectric film, and the fourth connection electrode is connected with the second driving electrode of the second bulk acoustic wave resonator through a via hole in the insulating layer, and the third connection electrode is connected with the second connection electrode to connect the first bulk acoustic wave resonator and the second bulk acoustic wave resonator in series.

13. The filter according to claim 11, wherein the bulk acoustic wave filter further comprises:

an air gap, located in the substrate, wherein, the first driving electrode is located at a side of the piezoelectric film close to the substrate, the second driving electrode is located at a side of the piezoelectric film away from the substrate, and the air gap is located at a side of the substrate close to the first driving electrode, or the air gap is located at a side of the substrate away from the first driving electrode.

14. The filter according to claim 10, wherein the M series resonators comprise a third bulk acoustic resonator and a fourth bulk acoustic resonator, the third bulk acoustic wave resonator and the fourth bulk acoustic wave resonator adopt a structure of the bulk acoustic wave resonator, the first driving electrode of the third bulk acoustic wave resonator is located at a side of the piezoelectric film away from the substrate, the second driving electrode of the third bulk acoustic wave resonator is located at a side of the piezoelectric film close to the substrate, the first driving electrode of the fourth bulk acoustic wave resonator is located at a side of the piezoelectric film close to the substrate, and the second driving electrode of the fourth bulk acoustic wave resonator is located at a side of the piezoelectric film away from the substrate, and the second driving electrode of the third bulk acoustic wave resonator and the first driving electrode of the fourth bulk acoustic wave resonator are arranged on a same layer and electrically connected, to connect the third bulk acoustic wave resonator and the fourth bulk acoustic wave resonator in series.

15. The filter according to claim 10, wherein the ith parallel branch comprises a third bulk acoustic wave resonator, the bridged resonator comprises a fourth bulk acoustic wave resonator, the third bulk acoustic wave resonator and the fourth bulk acoustic wave resonator adopt a structure of the bulk acoustic wave resonator, the first driving electrode of the third bulk acoustic wave resonator is located at a side of the piezoelectric film away from the substrate, the second driving electrode of the third bulk acoustic wave resonator is located at a side of the piezoelectric film close to the substrate, the first driving electrode of the fourth bulk acoustic wave resonator is located at a side of the piezoelectric film close to the substrate, and the second driving electrode of the fourth bulk acoustic wave resonator is located at a side of the piezoelectric film away from the substrate, and the second driving electrode of the third bulk acoustic wave resonator and the first driving electrode of the fourth bulk acoustic wave resonator are arranged on a same layer and electrically connected, to connect the third bulk acoustic wave resonator and the fourth bulk acoustic wave resonator in series.

16. The filter according to claim 14, wherein the bulk acoustic wave filter further comprises:

high acoustic impedance layers and low acoustic impedance layers that are alternately arranged, wherein the high acoustic impedance layers and the low acoustic impedance layers are located at a side of the piezoelectric film close to the substrate.

17. The filter according to claim 10, wherein the bridged resonator comprises a fifth bulk acoustic resonator, the (i+k)th series resonator comprises a sixth bulk acoustic wave resonator, the fifth bulk acoustic wave resonator and the sixth bulk acoustic wave resonator adopt a structure of the bulk acoustic wave resonator, the filter further comprises an insulating layer and a fifth connection electrode, a sixth connection electrode, a seventh connection electrode, and an eighth connection electrode that are located at a side of the insulation layer away from the substrate, the fifth connection electrode is electrically connected with the first driving electrode of the fifth bulk acoustic wave resonator through a via hole in the insulating layer and the piezoelectric film, the sixth connection electrode is electrically connected with the second driving electrode of the fifth bulk acoustic wave resonator through a via hole in the insulating layer, the seventh connection electrode is electrically connected with the first driving electrode of the sixth bulk acoustic wave resonator through a via hole in the insulating layer and the piezoelectric film, and the eighth connection electrode is connected with the second driving electrode of the sixth bulk acoustic wave resonator through a via hole in the insulating layer, the first inductor is located at a side of the insulating layer away from the substrate, and is respectively connected with the sixth connection electrode and the eighth connection electrode.

18. The filter according to claim 17, wherein the first inductor is a single-layer inductor or a three-dimensional inductor.

\* \* \* \* \*